United States Patent
Wang et al.

(10) Patent No.: US 9,385,740 B2
(45) Date of Patent: Jul. 5, 2016

(54) SAR ADC AND METHOD THEREOF

(71) Applicant: MEDIATEK Inc., Hsin-Chu (TW)

(72) Inventors: Chi Yun Wang, Tainan (TW); Jen-Che Tsai, Taichung (TW); Shu-Wei Chu, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/919,830

(22) Filed: Oct. 22, 2015

(65) Prior Publication Data

US 2016/0134300 A1 May 12, 2016

Related U.S. Application Data

(60) Provisional application No. 62/076,699, filed on Nov. 7, 2014.

(51) Int. Cl.
| | |
|---|---|
| *H03M 1/38* | (2006.01) |
| *H03M 1/46* | (2006.01) |
| *H03M 1/42* | (2006.01) |
| *H03M 1/12* | (2006.01) |
| *H03M 1/08* | (2006.01) |
| *H03M 1/40* | (2006.01) |

(52) U.S. Cl.
CPC ............ *H03M 1/462* (2013.01); *H03M 1/0854* (2013.01); *H03M 1/12* (2013.01); *H03M 1/1245* (2013.01); *H03M 1/38* (2013.01); *H03M 1/403* (2013.01); *H03M 1/42* (2013.01); *H03M 1/466* (2013.01)

(58) Field of Classification Search
CPC ..... H03M 1/462; H03M 1/0854; H03M 1/42; H03M 1/1245; H03M 1/466; H03M 1/12; H03M 1/38

USPC ........................................ 341/161, 155, 172
See application file for complete search history.

(56) References Cited

U.S. PATENT DOCUMENTS

| | | | | |
|---|---|---|---|---|
| 8,514,123 B2 * | 8/2013 | Le Tual | ................ | H03M 1/468 341/155 |
| 8,581,770 B2 * | 11/2013 | Wang | ................ | H03M 1/1295 341/144 |

(Continued)

OTHER PUBLICATIONS

Keller, et al.: "A Comparative Study on Excess-Loop-Delay Compensation Techniques for Continuous-Time Sigma-Delta Modulators"; IEEE Transactions on Circuits and Systems—I: Regular Papers, vol. 55, No. 11, Dec. 2008; pp. 3480-3487.

*Primary Examiner* — Brian Young
(74) *Attorney, Agent, or Firm* — McClure, Qualey & Rodack, LLP

(57) ABSTRACT

A SAR ADC including a comparator, an input switch unit, a positive conversion capacitor array, a negative conversion capacitor array, and a SAR controller is provided. The input switch unit alternately couples and decouples a differential analog input signal to the comparator. The positive and negative conversion capacitor arrays sample the differential analog input signal during the sampling phase. The SAR controller resets the switches in the capacitor arrays at the end of the sampling phase to change the sampled voltage into a residual signal, generates an intermediate digital code to control the switches during the conversion phase according to an output of the comparator to convert the residual signal to the intermediate digital code, generates the digital code according to the intermediate digital code, and uses an inverted intermediate digital code to control the switches at the end of the conversion phase.

24 Claims, 19 Drawing Sheets

(56) References Cited

U.S. PATENT DOCUMENTS

| | | | |
|---|---|---|---|
| 8,599,059 B1 * | 12/2013 | Chung | H03M 1/466 341/163 |
| 8,797,204 B2 * | 8/2014 | Yoon | H03M 1/16 341/155 |
| 9,287,891 B1 * | 3/2016 | Lee | H03M 1/468 |

* cited by examiner

SAR ADC AND METHOD THEREOF

This application claims the benefit of U.S. provisional application Ser. No. 62/076,699, filed Nov. 7, 2014, the subject matter of which is incorporated herein by reference.

FIELD OF THE INVENTION

The present invention relates to a successive approximation register (SAR) analog to digital converter (ADC), and more particularly, to a SAR ADC with inherent excess loop delay (ELD) compensation characteristic when used in a continuous-time delta-sigma modulator.

BACKGROUND OF THE INVENTION

Delta-sigma modulator for analog-to-digital converting is a key building block of modern signal/audio/video processing circuits and communication circuits. Delta-sigma ADC is based on the technique of oversampling to reduce the noise in the band of interest. With oversampling, the quantizer within the delta-sigma ADC may be a simple ADC with lower resolution to be cost effective.

Since real circuit blocks always introduce some time delay in performing sampling, quantization, and digital-to-analog conversion, excess loop delay (ELD) is a well known non-ideality of continuous-time delta-sigma modulators. ELD is an important concern in high sampling rate delta-sigma modulators due to its detrimental effect on performance and stability. Thus there is a need for a technique for dealing with the ELD problem.

SUMMARY OF THE INVENTION

The disclosure is directed to a SAR ADC. One of the advantages of the proposed SAR ADC is its inherent ELD compensation characteristic when used in a continuous-time delta-sigma modulator.

According to one embodiment, a SAR ADC is provided. The SAR ADC generates a digital code in response to a differential analog input signal. The SAR ADC includes a comparator, an input switch unit, a positives capacitor array, a negative capacitor array, and a SAR controller. The comparator has a first input terminal and a second input terminal. The input switch unit is arranged to couple the differential analog input signal to the comparator during a sampling phase and decouple the differential analog input signal to the comparator during a conversion phase. The positive conversion capacitor array includes a plurality of first positive capacitors and a plurality of first positive switches, arranged to sample a positive end of the differential analog input signal during the sampling phase, wherein each first positive capacitor is coupled between the first input terminal of the comparator and a corresponding first positive switch, respectively, for selectively coupling the first positive capacitor to either a first reference voltage or a common voltage. The negative conversion capacitor array includes a plurality of first negative capacitors and a plurality of first negative switches, arranged to sample a negative end of the differential analog input signal during the sampling phase, wherein each first negative capacitor is coupled between the second input terminal of the comparator and a corresponding first negative switch, respectively, for selectively coupling the first negative capacitor to either the first reference voltage or the common voltage. The SAR controller is arranged to reset the first positive switches and the first negative switches at the end of the sampling phase to change an input voltage difference between the first and second input terminals of the comparator into a residual signal, generate an intermediate digital code to control the first positive switches and the first negative switches during the conversion phase according to an output of the comparator to convert the residual signal to the intermediate digital code, generate the digital code according to the intermediate digital code, and use an inverted intermediate digital code to control the first positive switches and the first negative switches at the end of the conversion phase.

According to one embodiment, a SAR ADC is provided. The SAR ADC generates a digital code in response to a differential analog input signal. The SAR ADC includes a comparator, an input switch with polarity inversion unit, a positives capacitor array, a negative capacitor array, and a SAR controller. The comparator has a first input terminal and a second input terminal. The input switch with polarity inversion unit is arranged to couple the differential analog input signal to the comparator during a sampling phase and decouple the differential analog input signal to the comparator during a conversion phase, couple a positive and negative end of the differential analog input signal to the first and second input terminal of the comparator, respectively, in a normal cycle, and couple the positive and negative end of the differential analog input signal to the second and first input terminal of the comparator, respectively, in an alternate cycle, wherein each of the normal cycle and the alternate cycle comprises the sampling phase and the conversion phase. The positive conversion capacitor array includes a plurality of first positive capacitors and a plurality of first positive switches, arranged to sample voltage at the first input terminal of the comparator during the sampling phase, wherein each first positive capacitor is coupled between the first input terminal of the comparator and a corresponding first positive switch, respectively, for selectively coupling the first positive capacitor to either a first reference voltage or a common voltage. The negative conversion capacitor array includes a plurality of first negative capacitors and a plurality of first negative switches, arranged to sample voltage at the second input terminal of the comparator during the sampling phase, wherein each first negative capacitor is coupled between the second input terminal of the comparator and a corresponding first negative switch, respectively, for selectively coupling the first negative capacitor to either the first reference voltage or the common voltage. The SAR controller is arranged to reset the first positive switches and the first negative switches at the end of the sampling phase to change an input voltage difference between the first and second input terminals of the comparator into a residual signal, generate an intermediate digital code to control the first positive switches and the first negative switches during the conversion phase according to an output of the comparator to convert the residual signal to the intermediate digital code, and generate the digital code by inverting the intermediate digital code in every alternate cycle.

According to one embodiment, a SAR ADC is provided. The SAR ADC generates a digital code in response to an analog input signal. The SAR ADC includes a comparator, an input switch unit, a conversion capacitor array, and a SAR controller. The comparator has a first input terminal and a second input terminal, wherein the second input terminal is coupled to a base voltage. The input switch unit is arranged to couple the analog input signal to the comparator during a sampling phase and decouple the analog input signal to the comparator during a conversion phase. The conversion capacitor array includes a plurality of first capacitors and a plurality of first switches, arranged to sample the analog input signal during the sampling phase, wherein each first capacitor is coupled between the first input terminal of the comparator and a corresponding first switch, respectively, for selectively coupling the first capacitor to either a first reference voltage or a common voltage. The SAR controller is arranged to reset the first switches at the end of the sampling phase to change the sampled analog input signal into a residual signal, generate an intermediate digital code to control the first switches during the conversion phase according to an output of the comparator to convert the residual signal to the intermediate digital code, generate the digital code according to the intermediate digital code, and use an inverted intermediate digital code to control the first switches at the end of the conversion phase.

According to one embodiment, a SAR ADC is provided. The SAR ADC generates a digital code in response to an analog input signal. The SAR ADC includes a comparator, an input switch with polarity inversion unit, a conversion capacitor array, and a SAR controller. The comparator has a first input terminal and a second input terminal, wherein the second input terminal is coupled to a base voltage. The input switch with polarity inversion unit is arranged to couple the analog input signal to the comparator during a sampling phase and decouple the analog input signal to the comparator during a conversion phase, and perform polarity inversion on the analog input signal every alternate cycle to generate a modified input signal, wherein one cycle comprises the sampling phase and the conversion phase. The conversion capacitor array includes a plurality of first capacitors and a plurality of first switches, arranged to sample the modified input signal during the sampling phase, wherein each first capacitor is coupled between the first input terminal of the comparator and a corresponding first switch, respectively, for selectively coupling the first capacitor to either a first reference voltage or a common voltage. The SAR controller is arranged to reset the first switches at the end of the sampling phase to change the modified input signal into a residual signal, generate an intermediate digital code to control the first switches during the conversion phase according to an output of the comparator to convert the residual signal to the intermediate digital code, and generate the digital code by inverting the intermediate digital code every alternate cycle.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

Figure 1:
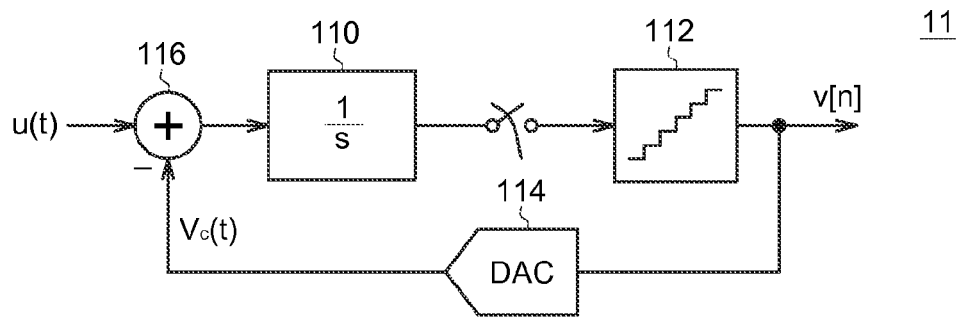
FIG. 1 illustrates a block diagram of a continuous-time delta-sigma modulator.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF PREFERRED EMBODIMENTS

FIG. 1 illustrates a block diagram of a continuous-time delta-sigma modulator, for converting an analog signal u(t) to a digital code v[n]. The delta-sigma modulator 11 includes a loop filter 110, a quantizer 112, a feedback digital-to-analog converter (DAC) 114, and an analog adder (or subtractor) 116. For a first-order delta-sigma modulator, the loop filter 110 may be a simple integrator with transfer function equal to $s^{-1}$, which may be implemented by an op-amp and a capacitor. The quantizer 112 may be a SAR ADC for converting the sampled analog signal to a digital code v[n]. The DAC 114 converts the digital code v[n] to a feedback analog signal $v_c(t)$. The difference $u(t)-v_c(t)$ is fed into the loop filter 110 to perform delta-sigma modulation. Because quantizer 112 requires finite regeneration time, and op-amp in the loop filter 110 has finite gain-bandwidth, real circuit blocks introduce ELD inevitably. The first-order delta-sigma modulator is used here to simplify the illustration. The invention could also be applied to higher-order delta-sigma modulators.

Figure 2:
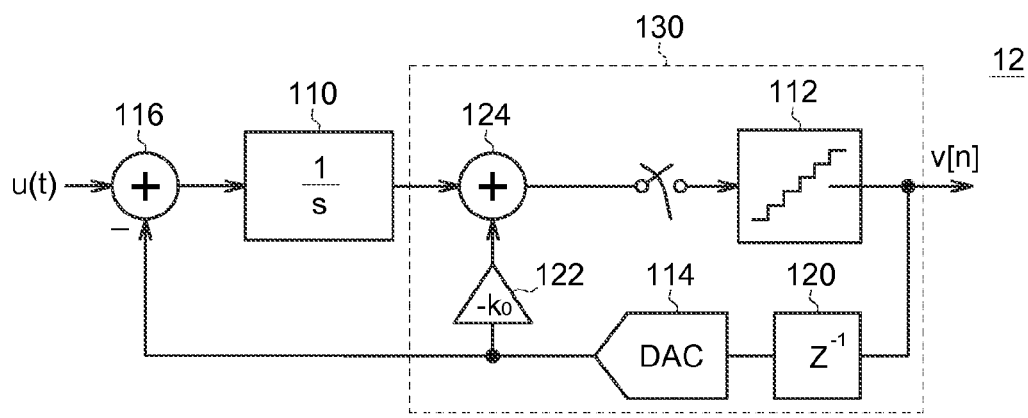
FIG. 2 illustrates a block diagram of ELD compensation used in a delta-sigma modulator.

FIG. 2 illustrates a block diagram of ELD compensation used in a delta-sigma modulator. In the delta-sigma modulator 12 shown in FIG. 2, there is an extra path added around the quantizer 112 as compared to the delta-sigma modulator 11 shown in FIG. 1. A delay element 120 in digital domain, which is not limited to $z^{-1}$ as shown in the figure, models the effect of ELD. To compensate the ELD, appropriate scaling factor k0 (amplifier 122 with gain factor $-k0$ shown in FIG. 2) and an extra analog adder (or subtractor) 124 are required. The scaling factor k0 is related to the actual ELD value. With this extra feedback path added and appropriate value of scaling factor k0, ELD effect may be compensated. That is, for ELD compensation, the input to the quantizer 112 is equal to $(U-k0 \cdot z^{-1}V)$ (Z-transform representation).

A simple ELD compensation approach is shown in FIG. 2. The ELD compensated quantizer 130 includes the quantizer 112, the delay element 120, the DAC 114, the amplifier 122, and the adder 124. This compensation circuit requires additional hardware cost, such as an extra adder 124 and a scaling factor k0, possibly implemented by an op-amp and a DAC. In this disclosure, a SAR ADC, used as a quantizer in the delta-sigma modulator, with inherent ELD compensation characteristic is proposed. In other words, the ELD compensated quantizer 130 may be replaced by the proposed SAR ADC. Hence the additional hardware cost of ELD compensation as mentioned above can be avoided.

Figure 3:
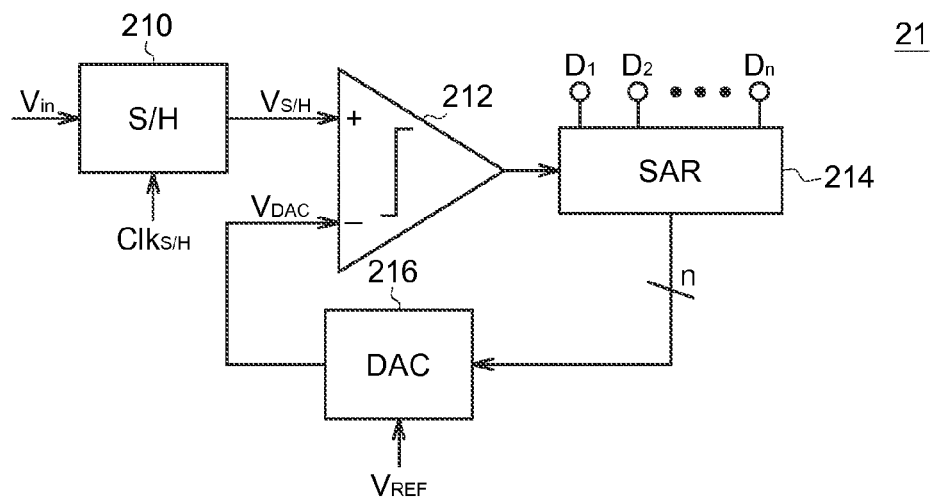
FIG. 3 illustrates a block diagram of a SAR ADC.

For a better understanding of the proposed SAR ADC and the method thereof, the operation principle of a general type SAR ADC is examined first. FIG. 3 illustrates a block diagram of a SAR ADC, for converting an analog input signal $V_{in}$ to an output digital code $D_n$-$D_1$. The SAR ADC 21 includes a sample and hold circuit 210, a comparator 212, a SAR logic 214, and an internal DAC 216. The SAR logic 214 controls the digital code that is fed into the DAC 216 to successively approximate the sampled input signal $V_{S/H}$. Specifically, the SAR logic 214 gradually sets the digital code from MSB to LSB 1-bit by 1-bit, for example, starting from digital code 100 . . . 0 that corresponds to ½ reference voltage $V_{REF}$ of the DAC 216. The comparator 212 compares the sampled input signal $V_{S/H}$ and the DAC output signal $V_{DAC}$ from DAC 216. The SAR logic 214 sets the digital code according to the output result from the comparator 212.

Figure 4:
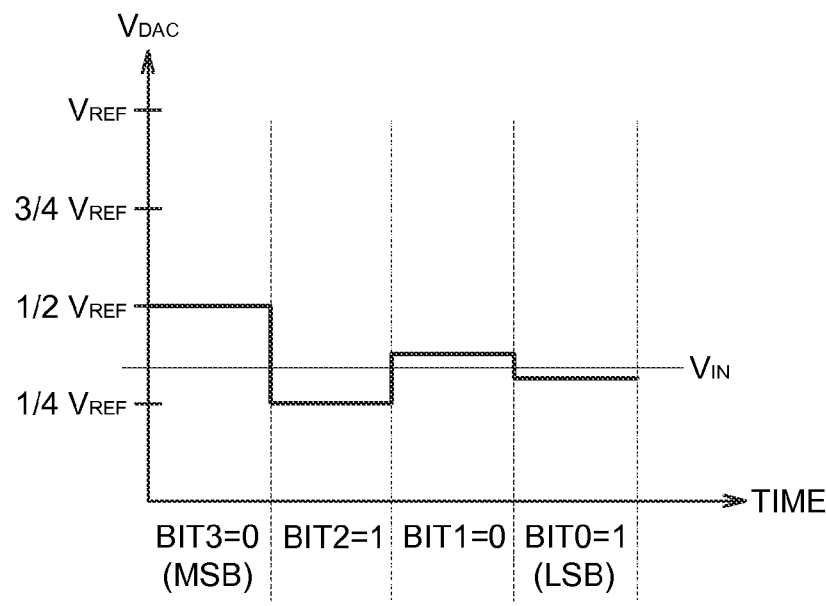
FIG. 4 illustrates a signal waveform of the SAR ADC.

FIG. 4 illustrates a signal waveform of the SAR ADC shown in FIG. 3. The SAR ADC 21 uses a binary search algorithm to converge on the sampled input signal $V_{S/H}$. As the digital code is successively set from MSB to LSB, the DAC output signal $V_{DAC}$ successively approximates the sampled input signal $V_{S/H}$.

Discussed above is the general operation principle of a SAR ADC. It should be noted that a possible implementation of a SAR ADC is a charge-redistribution SAR ADC, in which a charge scaling DAC is used. The charge scaling DAC may include an array of individually switched capacitors. The amount of charge upon each capacitor in the array is used to perform the aforementioned binary search in conjunction with a comparator and the SAR logic. In the charge-redistribution SAR ADC, the capacitor array that acts as DAC may also be used for the sampling purpose. That is, the charge scaling DAC may implicitly incorporate the feature of sample and hold due to the charge storage nature of the capacitors. Similar to the waveform shown in FIG. 4, the voltage difference between the two input terminals of the comparator successively approaches zero. The DAC operation is based on the principle of charge redistribution, and hence both the sampling and the conversion happen in the same capacitor array. One input terminal of the comparator may be coupled to the capacitor array, while the other input terminal of the comparator may be coupled to a constant base voltage, such as ground level. In this example, the difference of the sampled analog input $V_{S/H}$ and the DAC output signal $V_{DAC}$ ($V_{S/H}-V_{DAC}$) gradually approaches to ground level.

Figure 5:
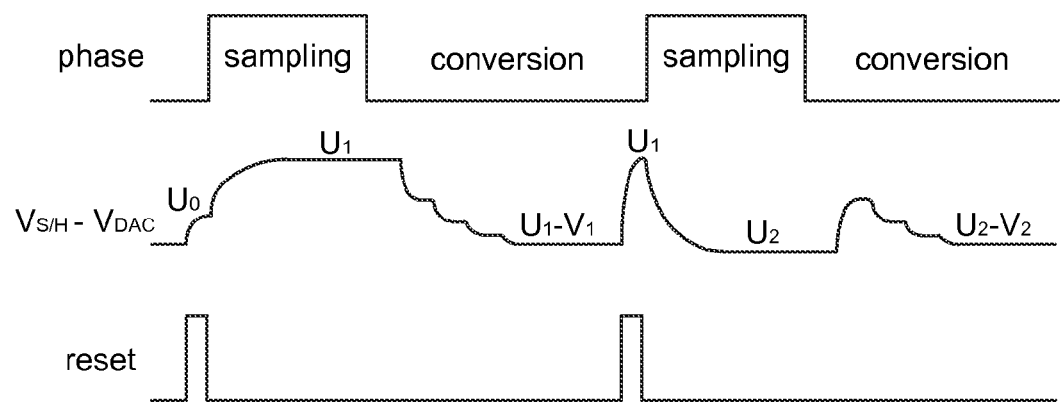
FIG. 5 illustrates a signal waveform of multiple consecutive cycles of the SAR ADC.

FIG. 5 illustrates a signal waveform of two consecutive cycles of the SAR ADC. One sampling cycle may be divided into a sampling phase and a conversion phase. In the first cycle, during the sampling phase, the analog input signal is sampled and hence the comparator input ($V_{S/H}-V_{DAC}$) is $U_1$. During the conversion phase, assumes the final conversion result is $V_1$, the resultant comparator input ($V_{S/H}-V_{DAC}$) is then $U_1-V_1$, which corresponds to the quantization error of the DAC. As mentioned above, with the charge-redistribution SAR ADC architecture, the comparator input ($V_{S/H}-V_{DAC}$) gradually approaches to ground level when the conversion procedure completes. After conversion, the switches in the capacitor array are reset to prepare for another sampling. Because the switches are reset to the initial state, the comparator input ($V_{S/H}-V_{DAC}$) now returns to $U_1$ as before the conversion phase. The voltage level returns to $U_1$ may be equivalently regarded as a value $V_1$, which corresponds to the conversion result in the first sampling cycle, is added to the comparator input ($V_{S/H}-V_{DAC}$). The procedure then proceeds to the next sampling cycle to sample another voltage level $U_2$ and convert it to another result $V_2$. By exploiting the feature of adding the conversion result to the comparator input ($V_{S/H}-V_{DAC}$) when reset happens, a SAR ADC suitable for ELD compensation in a delta-sigma modulator is proposed.

Figure 6:
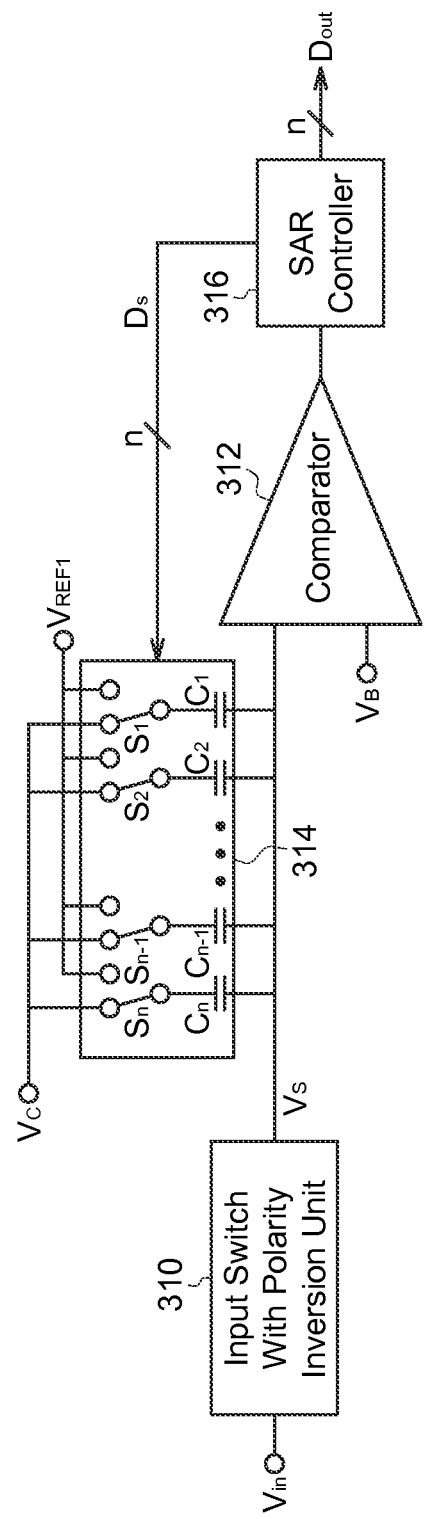
FIG. 6 illustrates a circuit diagram of a SAR ADC according to an embodiment of the invention.

FIG. 6 illustrates a circuit diagram of a SAR ADC according to an embodiment of the invention. The SAR ADC 31, for generating a digital code $D_{out}$ in response to an analog input $V_{in}$, includes a input switch with polarity inversion unit 310, a comparator 312, a conversion capacitor array 314, and a SAR controller 316. The input switch with polarity inversion unit 310 is arranged to couple the analog input signal $V_{in}$ to the comparator 312 during a sampling phase and decouple the analog input signal $V_{in}$ to the comparator 312 during a conversion phase. In addition, the input switch with polarity inversion unit 310 performs polarity inversion on the analog input signal $V_{in}$ every alternate cycle to generate a modified input signal at the comparator input $V_S$, wherein one cycle includes the sampling phase and the conversion phase. The comparator 312 has a first input terminal and a second input terminal, wherein the second input terminal is coupled to a base voltage $V_B$. The conversion capacitor array 314 includes first capacitors $C_n$-$C_1$ and first switches $S_n$-$S_1$, arranged to sample the modified input signal at the comparator input $V_S$ during the sampling phase, wherein each first capacitor $C_i$ is coupled between the first input terminal of the comparator 312 and a corresponding first switch $S_i$, respectively, for selectively coupling the first capacitor $C_i$ to either a first reference voltage $V_{REF1}$ or a common voltage $V_C$. The SAR controller 316 is arranged to reset the first switches $S_n$-$S_1$ at the end of the sampling phase to change the modified input signal at the comparator input $V_S$ into a residual signal R, generate an intermediate digital code Ds to control the first switches $S_n$-$S_1$ during the conversion phase according to an output of the comparator 312 to convert the residual signal R to the intermediate digital code Ds, and generate the digital code $D_{out}$ by inverting the intermediate digital code Ds every alternate cycle. The detailed description for the elements in the SAR ADC 31 is given below.

The conversion capacitor array 314 acts as both a sampling capacitor and a DAC. Each first capacitor $C_i$ corresponds to an individual first switch $S_i$ in the conversion capacitor array 314. Based on the principle of charge redistribution, the conversion capacitor array 314 is able to convert the sampled analog voltage to a digital output. The state of each the first switch (either common voltage $V_C$ or first reference voltage $V_{REF1}$) is controlled by the SAR controller 316 in order to facilitate SAR analog-to-digital conversion. The first reference voltage $V_{REF1}$ is related to the swing range of the analog input signal $V_{in}$. Each first switch $S_i$ may correspond to one bit of the intermediate digital code Ds, wherein the common voltage $V_C$ may correspond to logic 0 and the first reference voltage $V_{REF1}$ may correspond to logic 1. The first capacitors $C_n$-$C_1$ may be binary-weighted, for example, $C_2=2C_1$, $C_3=2C_2$, $C_4=2C_3$, etc.

The SAR controller 316 sets the intermediate digital code Ds according to the output of the comparator 312 during the conversion phase. The base voltage $V_B$ at the second input terminal of the comparator 312 may be equal to the common voltage $V_C$, the ground level, the first reference voltage $V_{REF1}$, or any appropriate voltage level that fits the DAC design criteria. For simplicity reason, the description below assumes that the base voltage $V_B$ and the common voltage $V_C$ are both equal to the ground level. Thus the comparator input $V_S$ successively approaches zero (the base voltage $V_B$) during the conversion phase.

Figure 7:
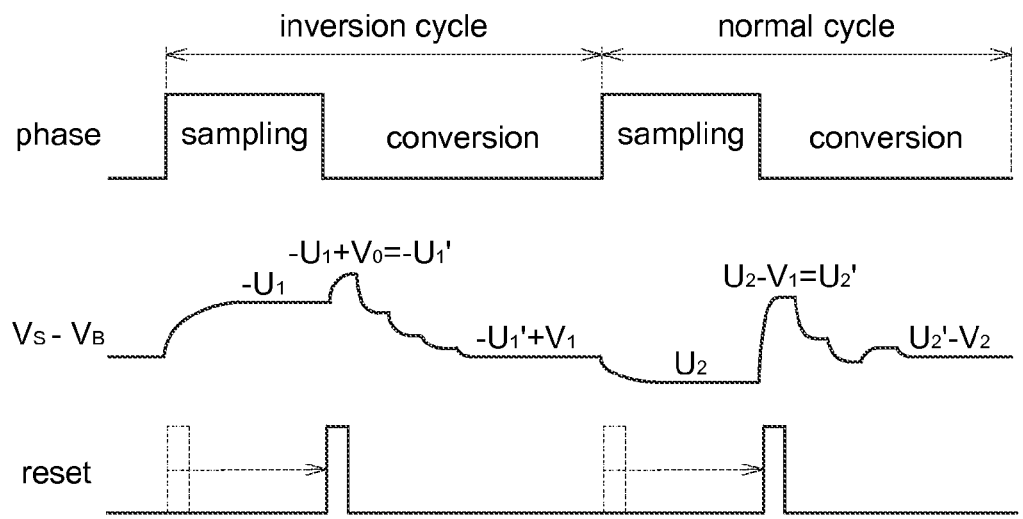
FIG. 7 illustrates a signal waveform of the SAR ADC according to an embodiment of the invention.

FIG. 7 illustrates a signal waveform of the SAR ADC according to an embodiment of the invention. The SAR controller 316 resets the first switches $S_n$-$S_1$ at the end of the sampling phase. In one embodiment, the first switches $S_n$-$S_1$ are switched to the initial state (for example, Ds=100 . . . 0) when being reset. In the first sampling cycle (inversion cycle), the sampling value and the conversion result are $U_1$ and $V_1$, respectively. The signal polarity is inverted in the first cycle, and thus the conversion result is actually $-V_1$ in the first sampling cycle. In the second sampling cycle (normal cycle), the sampling value is $U_2$. Because the first switches $S_n$-$S_1$ are reset after the sampling phase, and as mentioned above, the conversion result in the first sampling cycle is added to the comparator input $V_S$ when reset happens. That is, at the end of the sampling phase, the modified input signal at the comparator input $V_S$ is changed into a residual signal R. The residual signal R in the second cycle in this embodiment is equal to the sampled analog input signal in the second cycle subtracted by the conversion result in the first cycle. In other words, the analog voltage to be converted in the second cycle is equal to $U_2+(-V_1)$ (current sample value minus previous conversion result), which is exactly the same as the quantizer input for ELD compensation $(U-k0 \cdot z^{-1}V)$ when $k0=1$. Therefore, by alternating the signal polarity in consecutive cycles and adjusting the time instant at which the first switches $S_n$-$S_1$ are reset, a SAR ADC with inherent ELD compensation capability can be achieved when used in a delta-sigma modulator.

Because signal polarity is changed every alternate cycle, in order to generate the correct output digital code $D_{out}$, the output of the SAR ADC 31 has to be inverted every alternate cycle as well. In the inversion cycle, the comparator input $V_S$ equals $-V_{in}$ at the end of the sampling phase, and the comparator input $V_S$ becomes $-V_{in}$ adding the conversion result of the previous cycle after resetting, thus the digital code $D_{out}$ equals −Ds at the end of the conversion phase. While in the normal cycle, the comparator input $V_S$ equals $V_{in}$ at the end of the sampling phase, and the comparator input $V_S$ becomes $V_{in}$ subtracting the conversion result of the previous cycle after resetting, thus the digital code $D_{out}$ equals Ds at the end of the conversion phase.

Figure 8:
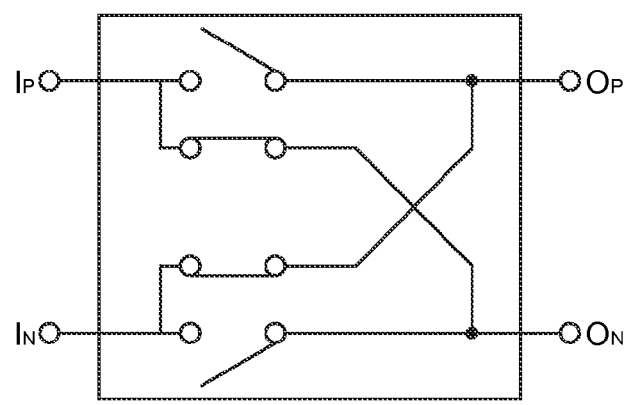
FIG. 8 illustrates a circuit diagram of the polarity inversion unit according to an embodiment of the invention.

The input switch with polarity inversion unit 310 may be implemented by switches with cross coupling (swapping input terminals). FIG. 8 illustrates a circuit diagram of the input switch with polarity inversion unit 310 according to an embodiment of the invention. For example, the input terminals $I_P$ and $I_N$ of the input switch with polarity inversion unit 310 may be connected to the analog input signal $V_{in}$ and the ground level respectively. The output terminals $O_P$ and $O_N$ of the input switch with polarity inversion unit 310 may be connected to the comparator input $V_S$ and the ground level respectively. On the other hand, the output digital code inversion may be implemented by an inverter and a multiplexer. With appropriate timing control, the input switch with polarity inversion unit 310 and the output digital code inversion can be performed correspondingly. That is, the output code is inverted when the input terminals are swapped.

Figure 21:
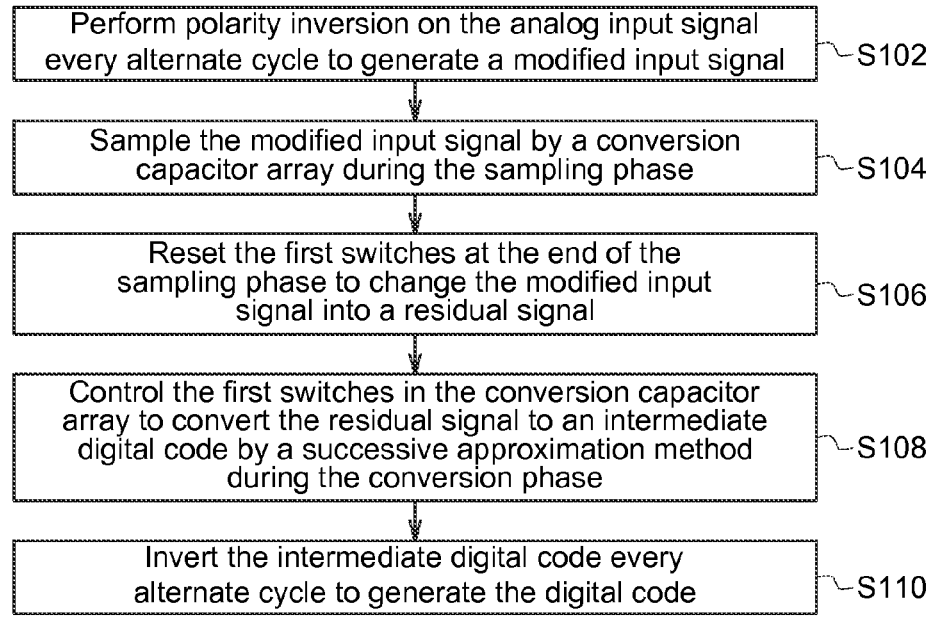
FIG. 21 illustrates a flowchart of generating a digital code in response to an analog input signal according to an embodiment of the invention.

FIG. 21 illustrates a flowchart of generating a digital code in response to an analog signal according to an embodiment of the invention. The method is as described above with the example SAR ADC shown in FIG. 6. The method includes the steps of: performing polarity inversion on the analog input signal every alternate cycle to generate a modified input signal (step S102), sampling the modified input signal by a conversion capacitor array during the sampling phase (step S104), resetting the first switches at the end of the sampling phase to change the modified input signal into a residual signal (step S106), controlling the first switches in the conversion capacitor array to convert the residual signal to an intermediate digital code by a successive approximation method during the conversion phase (step S108), inverting the intermediate digital code every alternate cycle to generate the digital code (step S110).

The SAR ADC disclosed herein may be used as a quantizer in a continuous-time delta-sigma modulator because the SAR ADC possesses the feature of inherent ELD compensation. The proposed SAR ADC architecture does not affect the sampling behavior of the quantizer and hence is easy to use and integrate. In addition, for a conventional ELD compensation approach, an extra amplifier or DAC is required, and gain-bandwidth requirement of the op-amp is tight. With the proposed SAR ADC, there is no extra hardware requirement for ELD compensation.

The embodiment shown in FIG. 6 corresponds to the case when the scaling factor k0=1. As the scaling factor k0 is related to the actual ELD value, scaling factor k0 may be other values in the real circuit. To address the issue of variable values of the scaling factor k0, the aforementioned SAR ADC is augmented with a scaling capacitor array.

Figure 9:
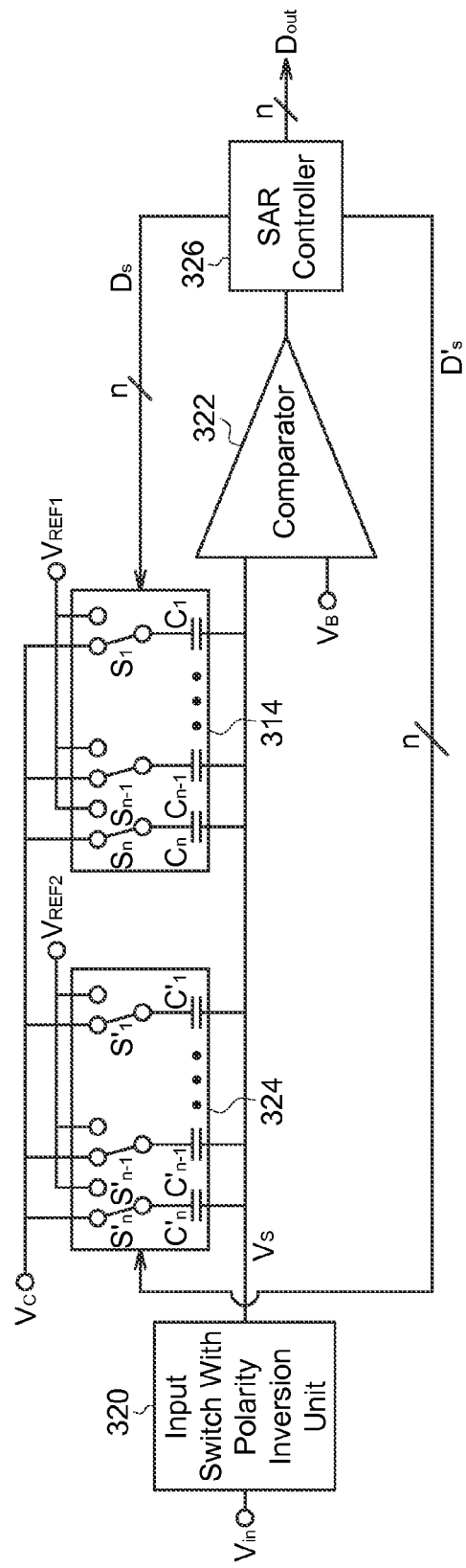
FIG. 9 illustrates a circuit diagram of the SAR ADC with a scaling capacitor array according to an embodiment of the invention.

FIG. 9 illustrates a circuit diagram of the SAR ADC with a scaling capacitor array according to an embodiment of the invention. In this embodiment, the SAR ADC 32 further includes a scaling capacitor array 324, which includes second capacitors $C'_n$-$C'_1$ and switches $S'_n$-$S'_1$. The structure of the scaling capacitor array 324 may be the same as the conversion capacitor array 314, with the same number of binary-weighted capacitors and switches. Each second capacitor $C'_i$ is connected to one switch $S'_i$ to be selectively coupled to either a second reference voltage $V_{REF2}$ or the common voltage $V_C$. The scaling capacitor array 324 is arranged to sample the modified input signal during the sampling phase. The second switches $S'_n$-$S'_1$ may be controlled by the SAR controller 326.

The scaling capacitor array 324 does not substantially participate in the digital conversion procedure. The second switches $S'_n$-$S'_1$ may remain in the same state during the conversion phase. The scaling capacitor array 324 is mainly responsible for adjusting the k0 value for ELD compensation. The charge ratio of the scaling capacitor array 324 to the conversion capacitor array 314 is K, where K is a positive real number. The charge ratio K represents the charge that the scaling capacitor array 324 stores is K times to that of the conversion capacitor array 314. Since charge Q equals capacitance C multiplied by voltage V, one possible implementation is to make a second capacitance value of each second capacitor $C'_i$ K times of a first capacitance value of the corresponding first capacitor $C_i$. Another possible implementation is to make the second reference voltage $V_{REF2}$ K times of the first reference voltage $V_{REF1}$.

Figure 10:
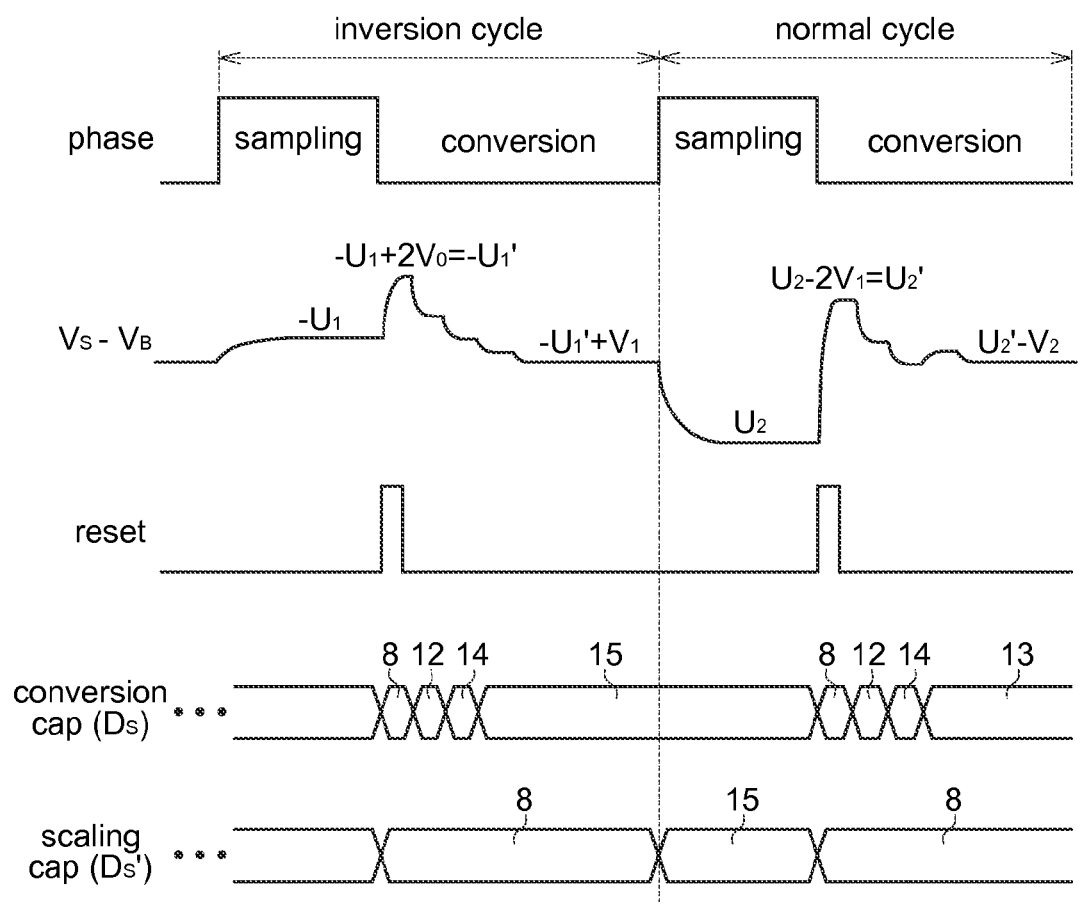
FIG. 10 illustrates a signal waveform when the scaling factor k0 is greater than 1 according to an embodiment of the invention.

FIG. 10 illustrates a signal waveform when the scaling factor k0 is greater than 1 according to an embodiment of the invention. In this example, the conversion capacitor array 314 is a 4-bit DAC. There are 4 switches in the conversion capacitor array 314 as well as in the scaling capacitor array 324. The binary state of each of the first switches $S_4$-$S_1$ and the second switches $S'_4$-$S'_1$ are represented in decimal numbers in FIG. 10 (state 1000 of 4 switches represented as 8).

At the end of conversion phase of the first sampling cycle, the SAR controller 326 uses the intermediate digital code Ds to control the second switches $S'_4$-$S'_1$. In other words, the code from the conversion capacitor array 314 is duplicated to the scaling capacitor array 324 at the end of the conversion phase (code 15 duplicated to the scaling capacitor array 324). At the end of the sampling phase of the second sampling cycle, the SAR controller 326 resets the second switches $S'_4$-$S'_1$ as well as the first switches $S_4$-$S_1$, and the previous conversion result is added to the comparator input $V_S$ (in this example, the initial state after reset is 1000). The residual signal R in the second cycle in this embodiment is equal to the sampled analog input signal in the second cycle subtracted by a scaled version (with scaling factor controlled by the scaling capacitor array 324) of the conversion result in the first cycle. Because the conversion result is duplicated to the scaling capacitor array 324, this reset actually adds $(1+K)(-V_1)$ to the current sample $U_2$. K equals 1 in the example shown in FIG. 10, hence the quantizer input is $(U_2-2V_1)$, which corresponds to k0=2 for ELD compensation. By appropriately adjusting the charge ratio K, any real number k0 greater than 1 can be achieved.

Figure 22:
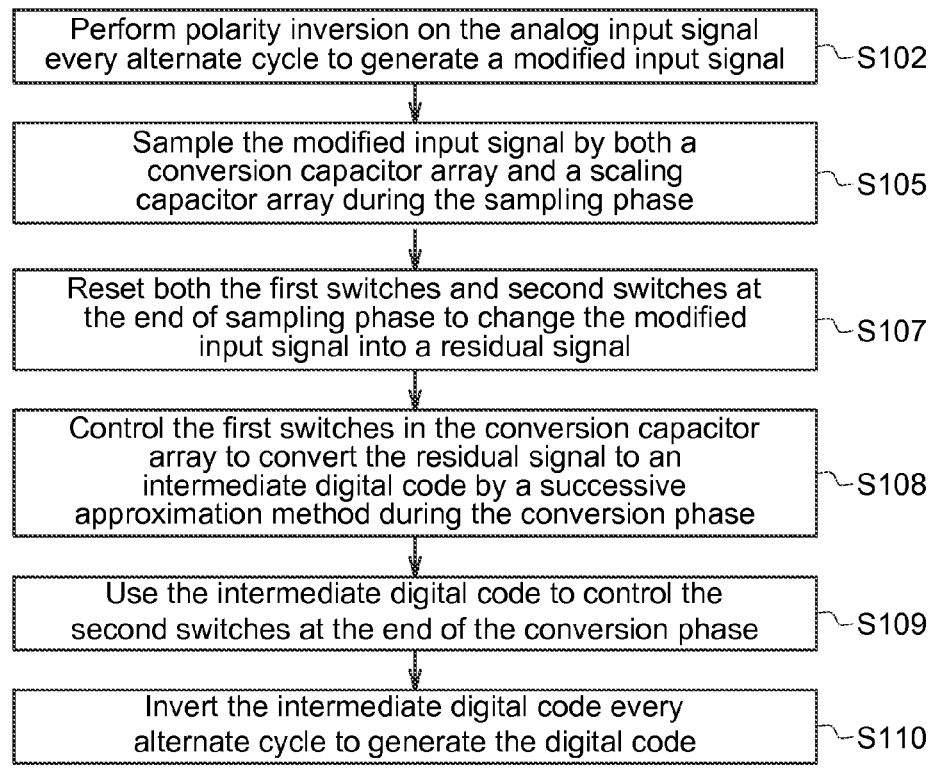
FIG. 22 illustrates a flowchart of generating a digital code in response to an analog input signal when the scaling factor k0 is greater than 1 according to an embodiment of the invention.

FIG. 22 illustrates a flowchart of generating a digital code in response to an analog input signal when the scaling factor k0 is greater than 1 according to an embodiment of the invention. The method is as described above with the example SAR ADC shown in FIG. 9. Compared to the flowchart shown in FIG. 21, the method has a step S105 slightly altered from the step S104: sampling the modified input signal by both a conversion capacitor array and a scaling capacitor array during the sampling phase, and a step S107 slightly altered from the step S106: resetting both the first switches and the second switches at the end of the sampling phase to change the modified input signal into a residual signal, and further include a step S109: using the intermediate digital code to control the second switches at the end of the conversion phase.

Figure 11:
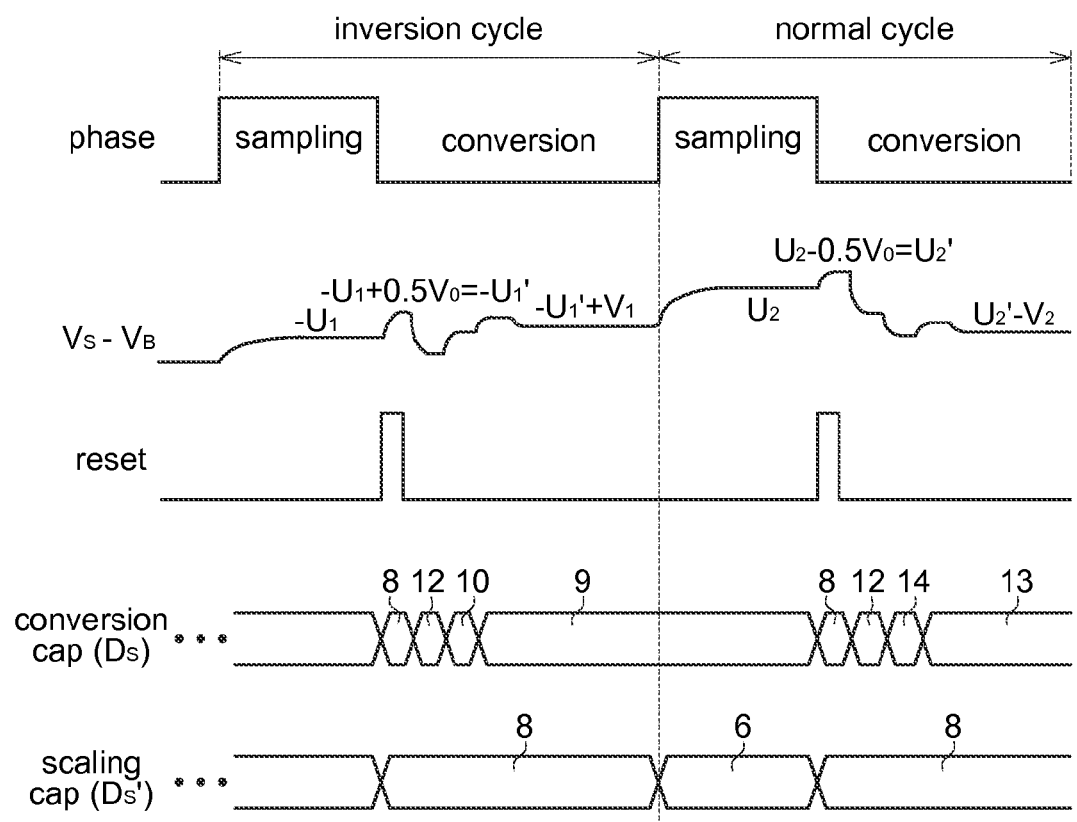
FIG. 11 illustrates a signal waveform when the scaling factor k0 is less than 1 according to an embodiment of the invention.

FIG. 11 illustrates a signal waveform when the scaling factor k0 is less than 1 according to an embodiment of the invention. At the end of conversion phase of the first sampling cycle, the SAR controller 326 inverts the intermediate digital code Ds to control the second switches $S'_4$-$S'_1$. In the example shown in FIG. 11, the code 1001(9) of the conversion capacitor array 314 is inverted to code 0110(6) to control the second switches $S'_4$-$S'_1$ in the scaling capacitor array 324. At the end of the sampling phase of the second sampling cycle, the SAR controller resets the second switches $S'_4$-$S'_1$ as well as the first switches $S_4$-$S_1$, and the previous conversion result is added to Vs. Because the conversion result is inversely duplicated to the scaling capacitor array 324, this reset actually adds $(1-K)(-V_1)$ to the current sample $U_2$. K equals 0.5 in the example shown in FIG. 11, hence the quantizer input is $(U_2-0.5V_1)$, which corresponds to k0=0.5 for ELD compensation. By appropriately adjusting the charge ratio K, any real positive number k0 less than 1 can be achieved.

Figure 23:
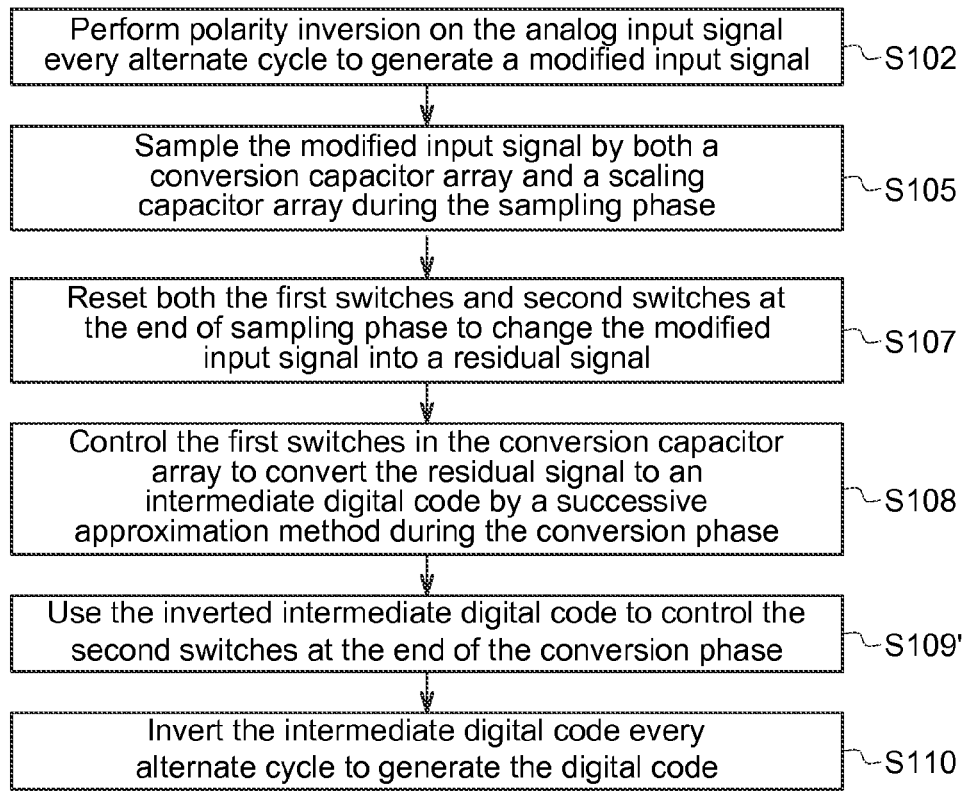
FIG. 23 illustrates a flowchart of generating a digital code in response to an analog input signal when the scaling factor k0 is smaller than 1 according to an embodiment of the invention.

FIG. 23 illustrates a flowchart of generating a digital code in response to an analog input signal when the scaling factor k0 is smaller than 1 according to an embodiment of the invention. The method is as described above with the example SAR ADC shown in FIG. 9. Compared to the flowchart shown in FIG. 21, the method has a step S105 slightly altered from step S104: sampling the modified input signal by both a conversion capacitor array and a scaling capacitor array during the sampling phase, and a step S107 slightly altered from step S106: resetting both the first switches and the second switches at the end of the sampling phase to change the modified input signal into a residual signal, and further include a step S109': using the inverted intermediate digital code to control the second switches at the end of the conversion phase.

As described above, the charge ratio K may be adjusted according to the scaling factor k0, which corresponds to the actual ELD value. Adjusting charge ratio K by making the second reference voltage $V_{REF2}$ adjustable may be beneficial to a dynamically adjustable ELD compensation circuit, since the variable voltage source is easy to generate as compared to variable capacitance value. For example, the variable voltage source may be implemented by a controlled voltage source or a voltage divider. With variable second reference voltage $V_{REF2}$ built in the SAR ADC, the K value and hence the k0 value can be adjusted dynamically to be able to meet accurate ELD compensation requirement.

Figure 12:
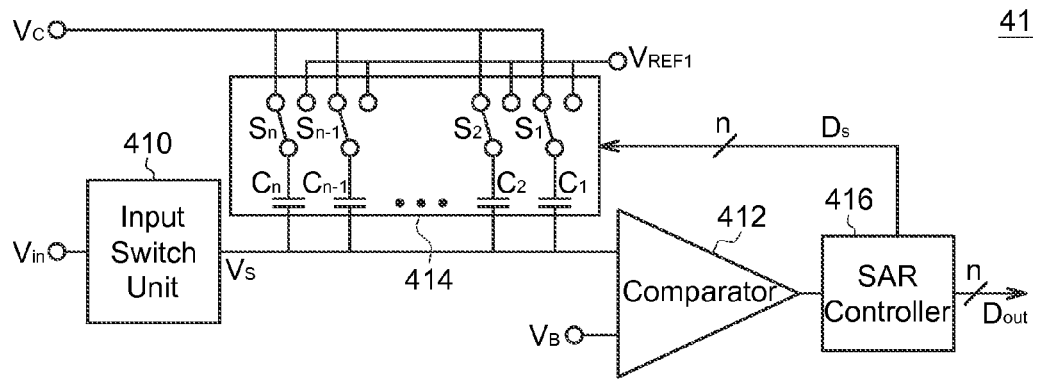
FIG. 12 illustrates a circuit diagram of a SAR ADC according to an embodiment of the invention.

Also disclosed herein is an embodiment of a SAR ADC without signal polarity inversion control. FIG. 12 illustrates a circuit diagram of a SAR ADC according to an embodiment of the invention. The SAR ADC 41, for generating a digital code $D_{out}$ in response to an analog input signal $V_{in}$, includes a input switch unit 410, a comparator 412, a conversion capacitor array 414, and a SAR controller 416. The input switch unit 410 is arranged to couple the analog input signal $V_{in}$ to the comparator 412 during a sampling phase and decouple the analog input signal $V_{in}$ to the comparator 412 during a conversion phase. The conversion capacitor array 414 is arranged to sample the analog input signal $V_{in}$ during the sampling phase. The SAR controller 416 is arranged to reset the first switches $S_n$-$S_1$ at the end of the sampling phase to change the sampled analog input signal at the comparator input $V_S$ into a residual signal R, generate an intermediate digital code Ds to control the first switches $S_n$-$S_1$ during the conversion phase according to an output of the comparator 412 to convert the residual signal R to the intermediate digital code Ds, generate the digital code $D_{out}$ according to the intermediate digital code Ds, and use an inverted intermediate digital code −Ds to control the first switches $S_n$-$S_1$ at the end of the conversion phase.

Figure 13:
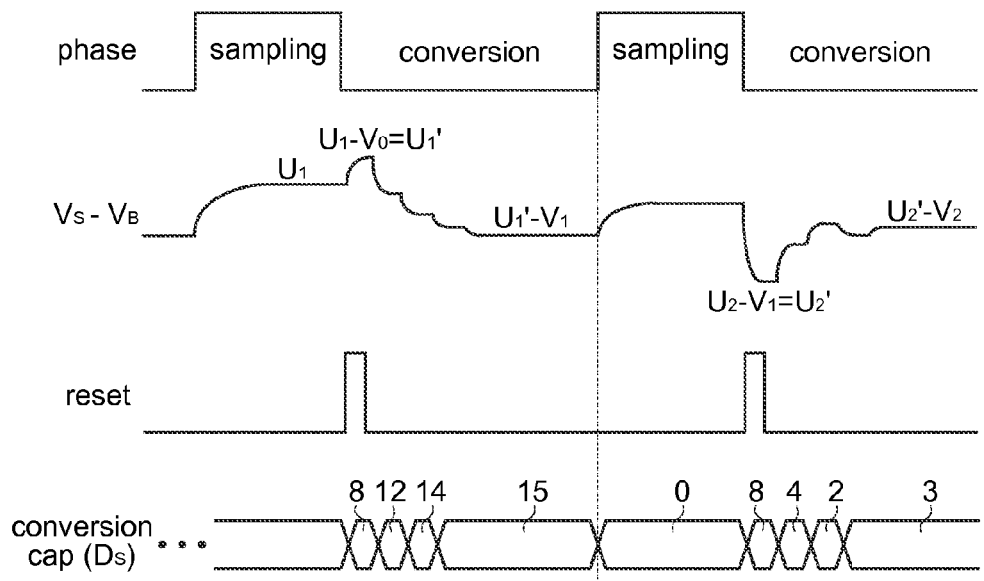
FIG. 13 illustrates a signal waveform of the SAR ADC according to an embodiment of the invention.

FIG. 13 illustrates a signal waveform of the SAR ADC according to an embodiment of the invention. The signal polarity does not change alternatively as compared to the waveform shown in FIGS. 7, 10, and 11. The control method in this embodiment is to invert the intermediate digital code Ds at the end of the conversion phase. As shown in FIG. 13, the code 1111(15) is inverted to code 0000(0) at the end of the conversion phase, which effectively transforms the conversion result from $V_1$ to $-V_1$. At the end of the sampling phase of the second sampling cycle, the reset adds the inverted value of the previous conversion result $-V_1$ to the current sample $U_2$. Therefore the residual signal R at the comparator input $V_S$, which is the analog voltage to be converted, is equal to $U_2+(-V_1)$ (current sample value minus previous conversion result), which is exactly the same as the quantizer input for ELD compensation $(U-k0 \cdot z^{-1}V)$ when k0=1.

In order to generate the correct output digital code $D_{out}$, the non-inverted intermediate digital code Ds has to be output as the digital code $D_{out}$. That is, at the end of the conversion phase, when the SAR controller 416 uses the inverted intermediate digital code −Ds to control the first switches $S_n$-$S_1$, the SAR controller 416 also generates the output digital code $D_{out}$ as the non-inverted intermediate digital code Ds (in the example shown in FIG. 13, code 15 is the correct output digital code $D_{out}$).

Figure 24:
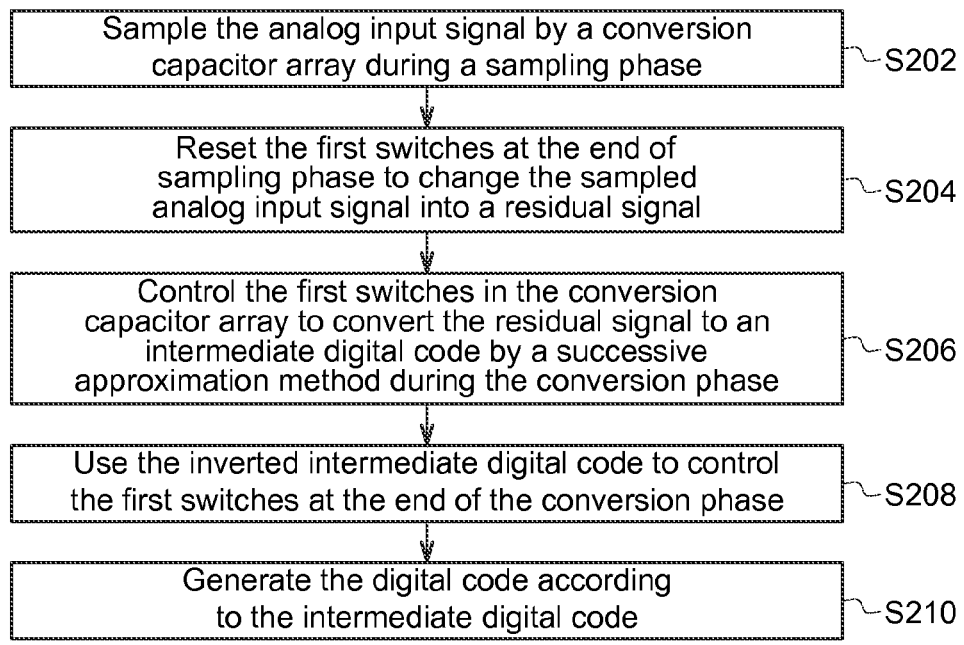
FIG. 24 illustrates a flowchart of generating a digital code in response to an analog input signal according to an embodiment of the invention.

FIG. 24 illustrates a flowchart of generating a digital code in response to an analog input signal according to an embodiment of the invention. The method is as described above with the example SAR ADC shown in FIG. 12. The method includes the steps of: sampling the analog input signal by a conversion capacitor array during a sampling phase (step S202), resetting the first switches at the end of the sampling phase to change the sampled analog input signal into a residual signal (step S204), controlling the first switches in the conversion capacitor array to convert the residual signal to an intermediate digital code by a successive approximation method during the conversion phase (step S206), using the inverted intermediate digital code to control the first switches at the end of the conversion phase (step S208), generating the digital code according to the intermediate digital code (step 210).

With the technique of internal code inversion as described above, not only the SAR ADC may be used for ELD compensation in a delta-sigma modulator, but also the hardware cost can be further reduced. There is no need for an input polarity inversion circuit or an output signal selection circuit, which further mitigates the side effects caused by these extra circuits and simplifies the timing control.

Figure 14:
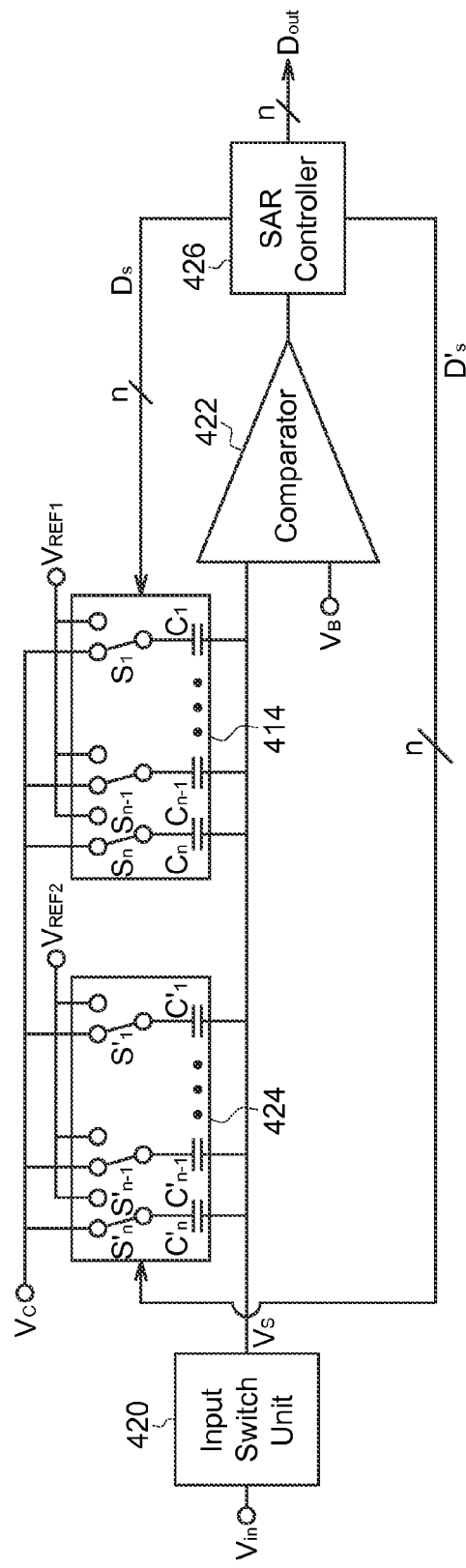
FIG. 14 illustrates a circuit diagram of the SAR ADC with a scaling capacitor array according to an embodiment of the invention.

FIG. 14 illustrates a circuit diagram of the SAR ADC with a scaling capacitor array according to an embodiment of the invention. In this embodiment, the SAR ADC 42 further includes a scaling capacitor array 424. The structure of SAR ADC 42 is similar to that of SAR ADC 32 shown in FIG. 9 except for the input switch with polarity inversion unit 320 is simply replaced by an input switch unit 420 now. The charge ratio of the scaling capacitor array 424 to the conversion capacitor array 414 is K. Charge ratio K may be adjusted by adjusting the capacitance value of first and second capacitors $C_n$-$C_1$ and $C'_n$-$C'_1$ and/or adjusting the first and second reference voltage $V_{REF1}$ and $V_{REF2}$.

Figure 15:
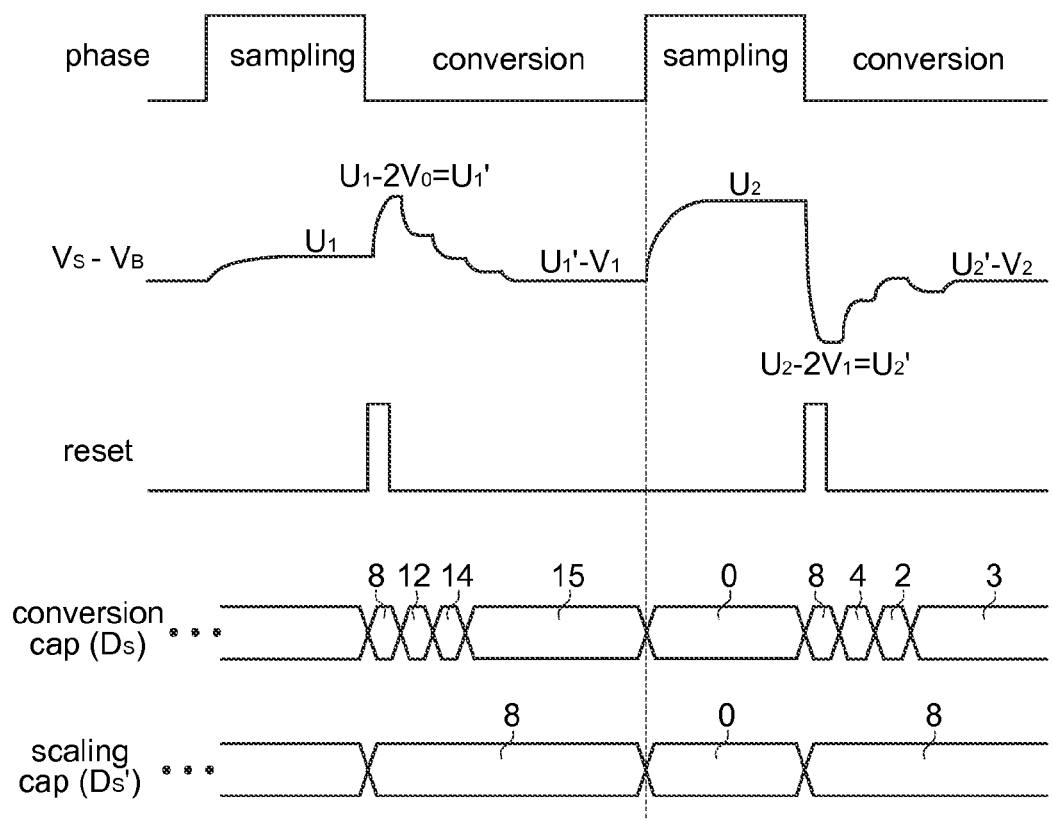
FIG. 15 illustrates a signal waveform when the scaling factor k0 is greater than 1 according to an embodiment of the invention.

FIG. 15 illustrates a signal waveform when the scaling factor k0 is greater than 1 according to an embodiment of the invention. There are 4 switches in the conversion capacitor array 414 as well as in the scaling capacitor array 424 in this example. The SAR controller 426 uses the inverted intermediate digital code −Ds to control the second switches $S'_4$-$S'_1$ at the end of the conversion phase. In this way, the state in the scaling capacitor array 424 is the same as the state in the conversion capacitor array 414. At the end of the sampling phase of the second sampling cycle, the SAR controller 426 resets the second switches $S'_4$-$S'_1$ as well as the first switches $S_4$-$S_1$, and the scaled inverted value of the previous conversion result is added to the comparator input $V_S$. This reset actually adds $(1+K)(-V_1)$ to the current sample $U_2$. K equals 1 in the example shown in FIG. 15, hence the quantizer input (the residual signal R) is $(U_2-2V_1)$, which corresponds to k0=2 for ELD compensation. By appropriately adjusting the charge ratio K, any real number k0 greater than 1 can be achieved.

Figure 25:
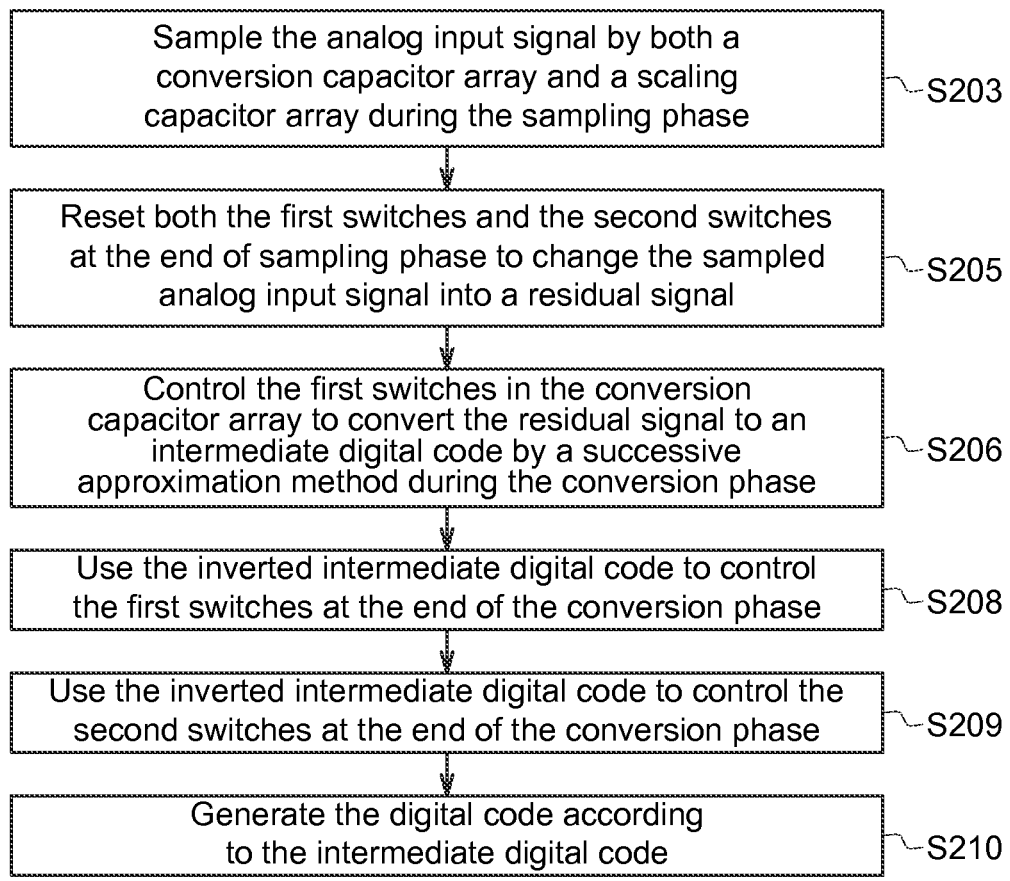
FIG. 25 illustrates a flowchart of generating a digital code in response to an analog input signal when the scaling factor k0 is greater than 1 according to an embodiment of the invention.

FIG. 25 illustrates a flowchart of generating a digital code in response to an analog input signal when the scaling factor k0 is greater than 1 according to an embodiment of the invention. The method is as described above with the example SAR ADC shown in FIG. 14. Compared to the flowchart shown in FIG. 24, the method has a step S205 slightly altered from the step S204: resetting both the first switches and the second switches at the end of the sampling phase to change the sampled analog input signal into a residual signal, and further includes a step S209: using the inverted intermediate digital code to control the second switches at the end of the conversion phase.

Figure 16:
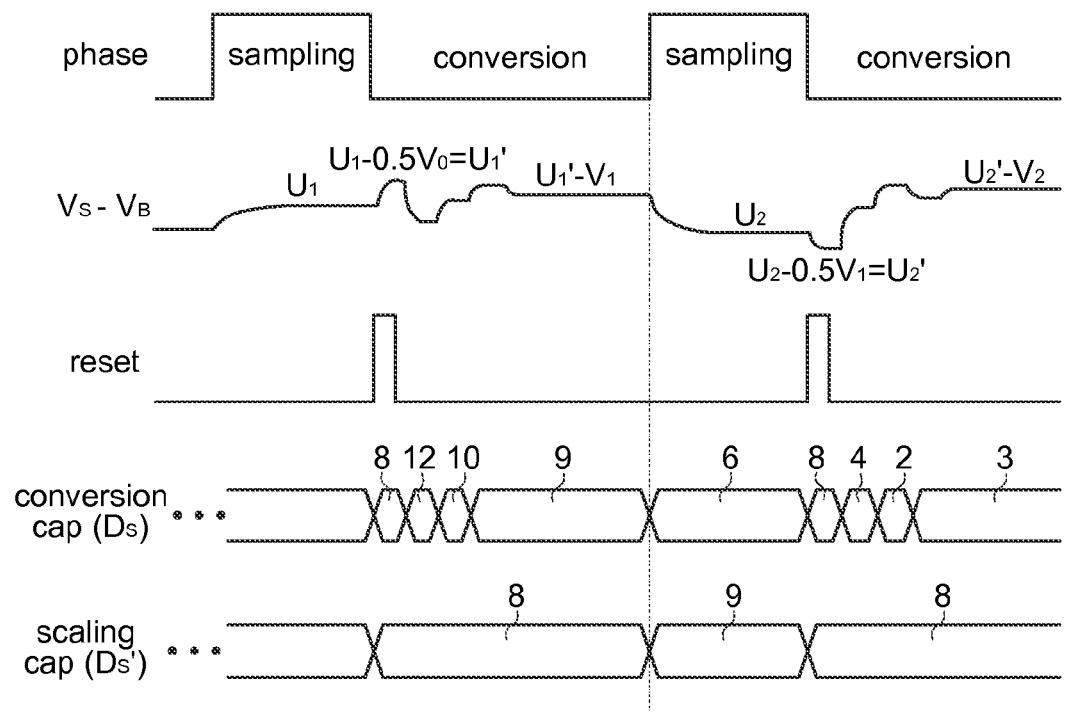
FIG. 16 illustrates a signal waveform when the scaling factor k0 is less than 1 according to an embodiment of the invention.

FIG. 16 illustrates a signal waveform when the scaling factor k0 is less than 1 according to an embodiment of the invention. The SAR controller 426 uses the intermediate digital code Ds to control the second switches $S'_4$-$S'_1$ at the end of the conversion phase. In this way, the state in the scaling capacitor array 424 is the inverted state as in the conversion capacitor array 414 (state 1001 in the scaling capacitor array 424, state 0110 in the conversion capacitor array 414). At the end of the sampling phase of the second sampling cycle, the SAR controller 426 resets the second switches $S'_4$-$S'_1$ as well as the first switches $S_4$-$S_1$, and the scaled inverted value of the previous conversion result is added to the comparator input $V_S$. This reset actually adds $(1-K)(-V_1)$ to the current sample $U_2$. K equals 0.5 in the example shown in FIG. 16, hence the quantizer input (the residual signal R) is $(U_2-0.5V_1)$, which corresponds to k0=0.5 for ELD compensation. By appropriately adjusting the charge ratio K, any real positive number k0 less than 1 can be achieved.

Figure 26:
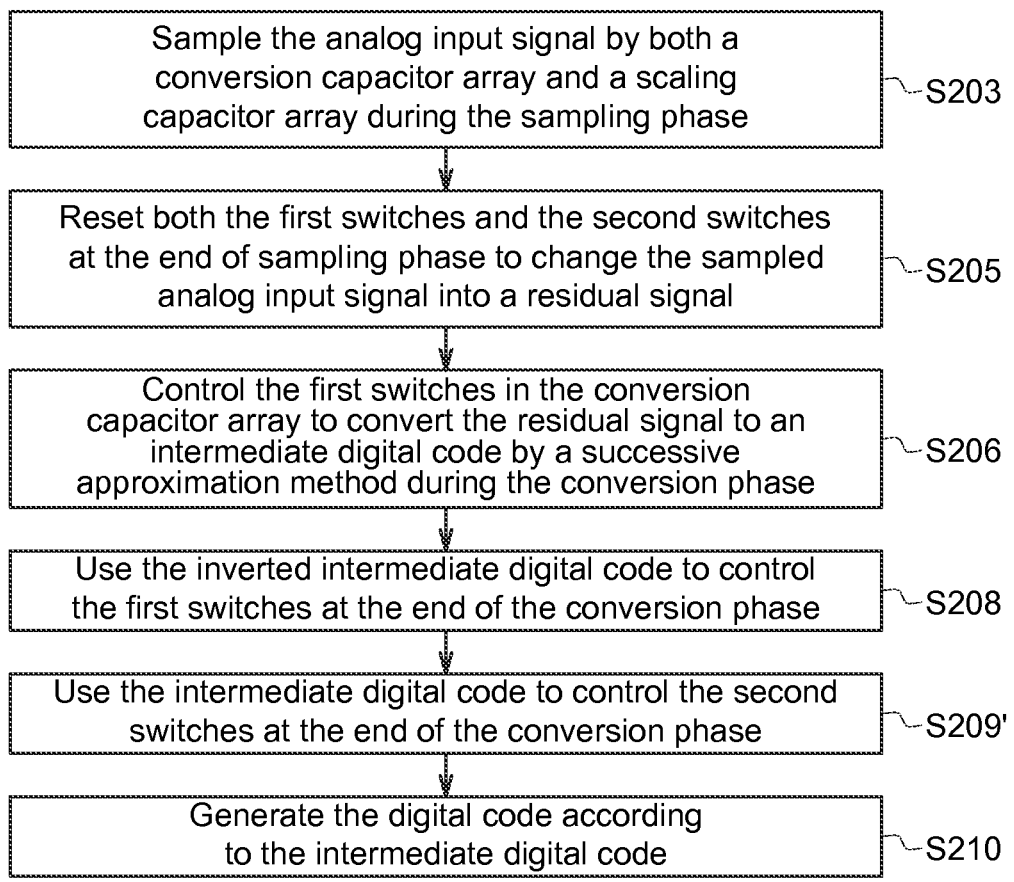
FIG. 26 illustrates a flowchart of generating a digital code in response to an analog input signal when the scaling factor k0 is smaller than 1 according to an embodiment of the invention.

FIG. 26 illustrates a flowchart of generating a digital code in response to an analog input signal when the scaling factor k0 is smaller than 1 according to an embodiment of the invention. The method is as described above with the example SAR ADC shown in FIG. 14. Compared to the flowchart shown in FIG. 24, the method has a step S205 slightly altered from step S204: resetting both the first switches and the second switches at the end of the sampling phase to change the sampled analog input signal into a residual signal, and further includes a step S209': using the intermediate digital code to control the second switches at the end of the conversion phase.

Figure 17:
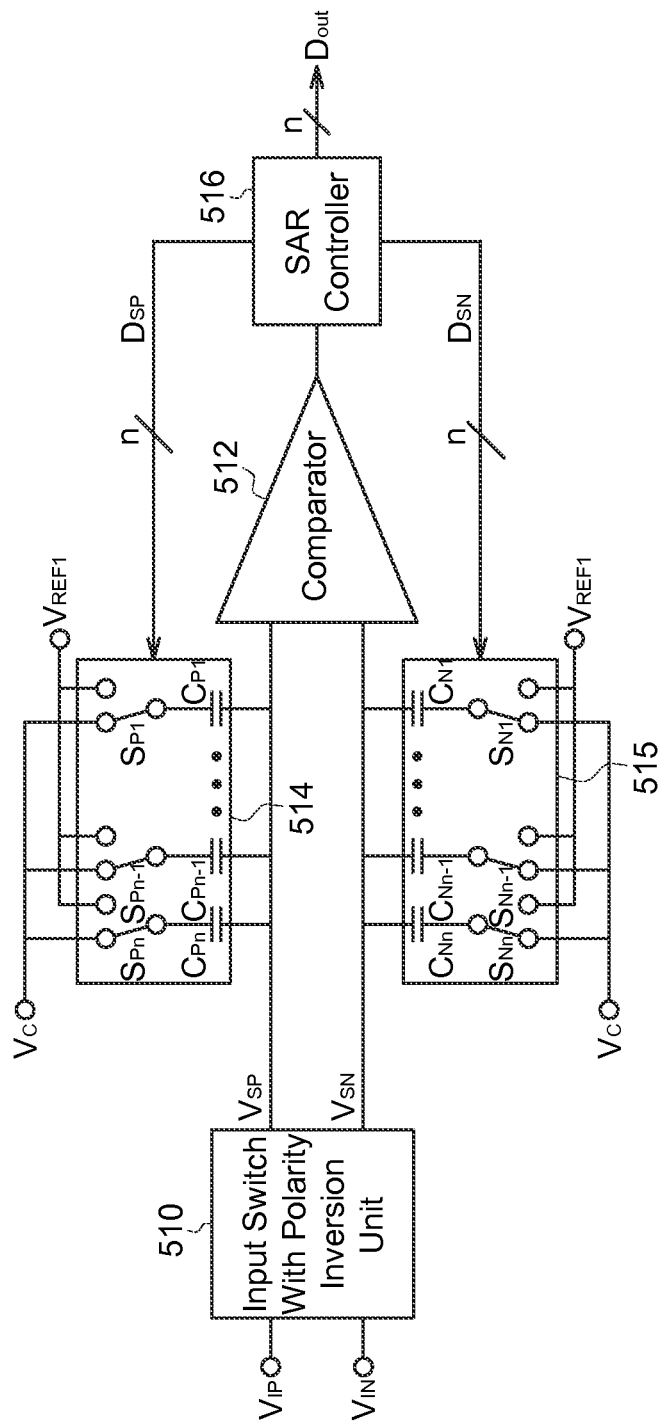
FIG. 17 illustrates a circuit diagram of a SAR ADC with differential input according to an embodiment of the invention.

Embodiments described above are ADCs with single-ended input. FIG. 17 illustrates a circuit diagram of a SAR ADC with differential input according to an embodiment of the invention. The SAR ADC 51, for generating a digital code $D_{out}$ in response to a differential analog input signal $V_{IP}$ and $V_{IN}$, includes a comparator 512, an input switch with polarity inversion unit 510, a positive conversion capacitor array 514, a negative conversion capacitor array 515, and a SAR controller 516. The input switch with polarity inversion unit 510 is arranged to couple the differential analog input signal to the comparator 512 during a sampling phase and decouple the differential analog input signal to the comparator 512 during a conversion phase. In addition, the input switch with polarity inversion unit 510 couples a positive and negative end of the differential analog input signal $V_{IP}$ and $V_{IN}$ to the first and second input terminal of the comparator 512, respectively, in a normal cycle, and couple the positive and negative end of the differential analog input signal $V_{IP}$ and $V_{IN}$ to the second and first input terminal of the comparator, respectively, in an alternate cycle, wherein each of the normal cycle and the alternate cycle includes the sample phase and the conversion phase.

The positive conversion capacitor array 514 includes multiple first positive capacitors $C_{Pn}$-$C_{P1}$ and first switches $S_{Pn}$-$S_{P1}$, arranged to sample voltage at the first input terminal of the comparator 512 during the sampling phase. Each first positive capacitor $C_{Pi}$ is coupled between the first input terminal of the comparator 512 and a corresponding first positive switch $S_{Pi}$, respectively, for selectively coupling the first positive capacitor $C_{Pi}$ to either a first reference voltage $V_{REF1}$ or a common voltage $V_C$. The negative conversion capacitor array 515 includes multiple first negative capacitors $C_{Nn}$-$C_{N1}$ and first switches $S_{Nn}$-$S_{N1}$, arranged to sample voltage at the second input terminal of the comparator 512 during the sampling phase. Each first negative capacitor $C_{Ni}$ is coupled between the second input terminal of the comparator 512 and a corresponding first negative switch $S_{Ni}$, respectively, for selectively coupling the first negative capacitor $C_{Ni}$ to either a first reference voltage $V_{REF1}$ or a common voltage $V_C$.

The SAR controller 516 is arranged to reset the first positive switches $S_{Pn}$-$S_{P1}$ and the first negative switches $S_{Nn}$-$S_{N1}$ at the end of the sampling phase to change an input voltage difference between the first and second input terminals of the comparator 512 into a residual signal R, generate an intermediate digital code Ds to control the first positive switches $S_{Pn}$-$S_{P1}$ and the first negative switches $S_{Nn}$-$S_{N1}$ during the conversion phase (for example $D_{SP}$=$D_{SN}$=Ds) according to an output of the comparator 512 to convert the residual signal R to the intermediate digital code Ds, and generate the digital code $D_{out}$ by inverting the intermediate digital code Ds every alternate cycle.

The structure of the positive conversion capacitor array 514 is similar to the conversion capacitor array 314 shown in FIG. 6. In addition, the positive conversion capacitor array 514 and the negative conversion capacitor array 515 are structurally symmetric and are both coupled to the first reference voltage $V_{REF1}$. The control method of the SAR ADC 51 is similar to that of the SAR ADC 31 shown in FIG. 6 and the flowchart shown in FIG. 21, and thus is not repeated here. The only difference is the analog input signal is differential in this embodiment. Each of the two input terminals of the comparator 512 is connected to a capacitor array. As compared to a single-ended SAR ADC, voltages at both the comparator inputs vary during the conversion phase. The voltage difference between the two input terminals of the comparator 512 successively approaches zero. The signal waveform of the SAR ADC 51 is similar to that shown in FIG. 7 except that the signal $V_S$-$V_B$ is replaced by the signal $V_{SP}$-$V_{SN}$ at the input terminals of the comparator 522.

Figure 18:
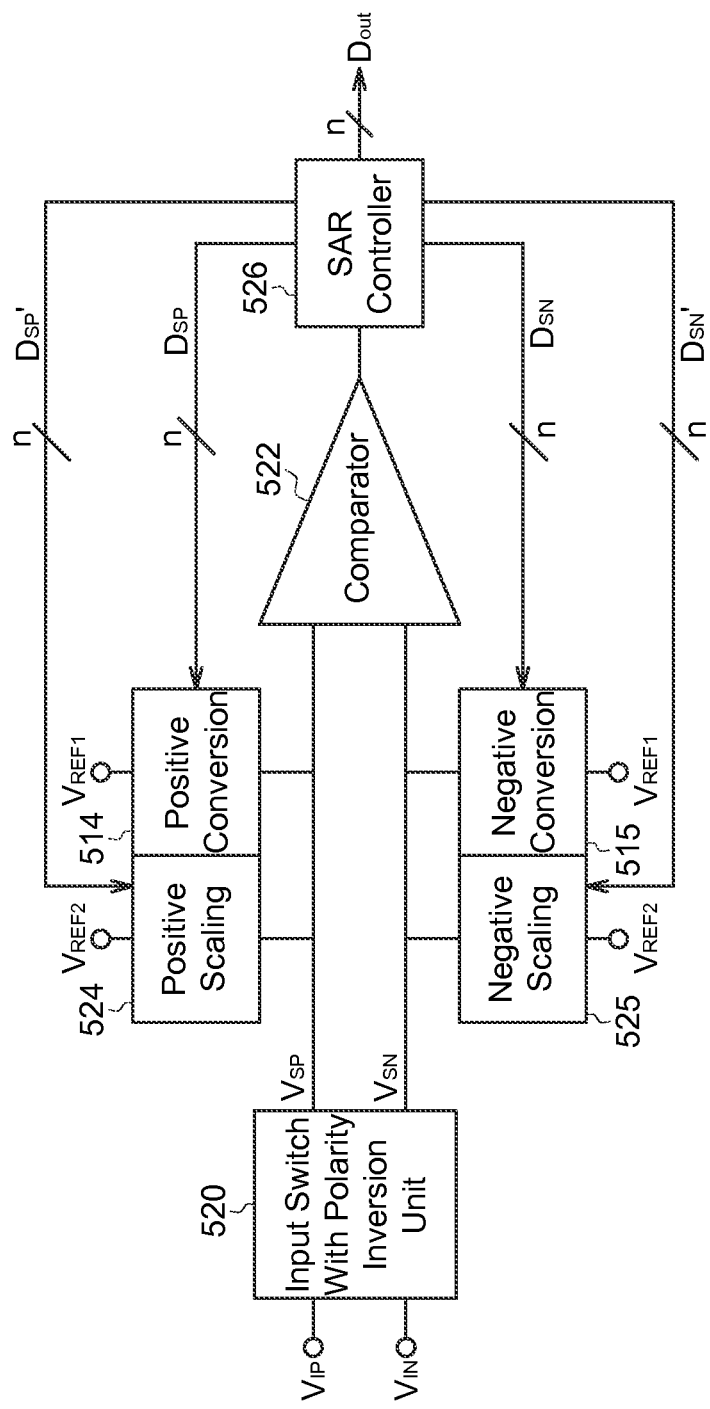
FIG. 18 illustrates a circuit diagram of the SAR ADC with differential input and with a scaling capacitor array according to an embodiment of the invention.

FIG. 18 illustrates a circuit diagram of the SAR ADC with differential input and with a scaling capacitor array according to an embodiment of the invention. This SAR ADC 52 further includes a positive scaling capacitor array 524 and a negative scaling capacitor 525. The control method is similar to that of SAR ADC 32 shown in FIG. 9 and flowcharts shown in FIG. 22 and FIG. 23, and thus is not repeated here. The positive scaling capacitor array 524 and the negative scaling capacitor 525 are used for adjusting the scaling factor k0.

Figure 19:
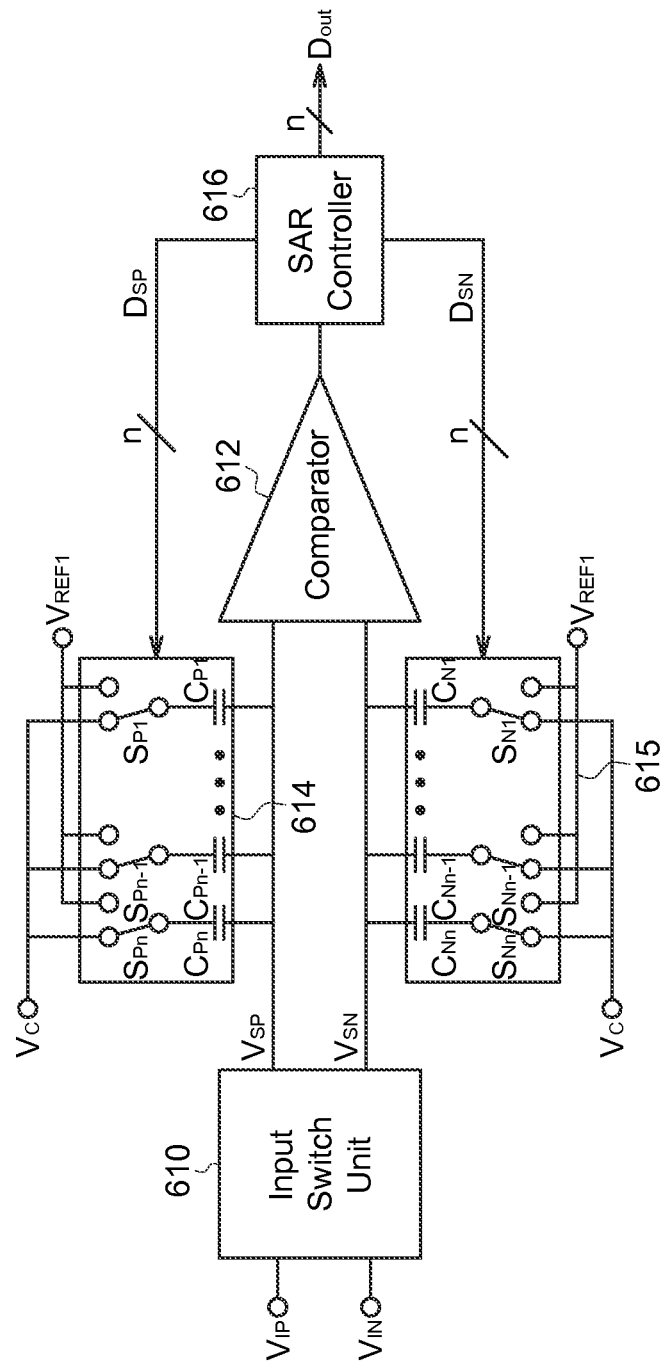
FIG. 19 illustrates a circuit diagram of a SAR ADC with differential input according to an embodiment of the invention.

FIG. 19 illustrates a circuit diagram of a SAR ADC with differential input according to an embodiment of the invention. The input switch unit 610 of the SAR ADC 61 does not have the polarity inversion/swapping function as compared to the SAR ADC 51 shown in FIG. 17. The control method is similar to that of SAR ADC 41 shown in FIG. 12 and flowchart shown in FIG. 24, and thus is not repeated here. The intermediate digital code at the end of the conversion phase is inverted.

Figure 20:
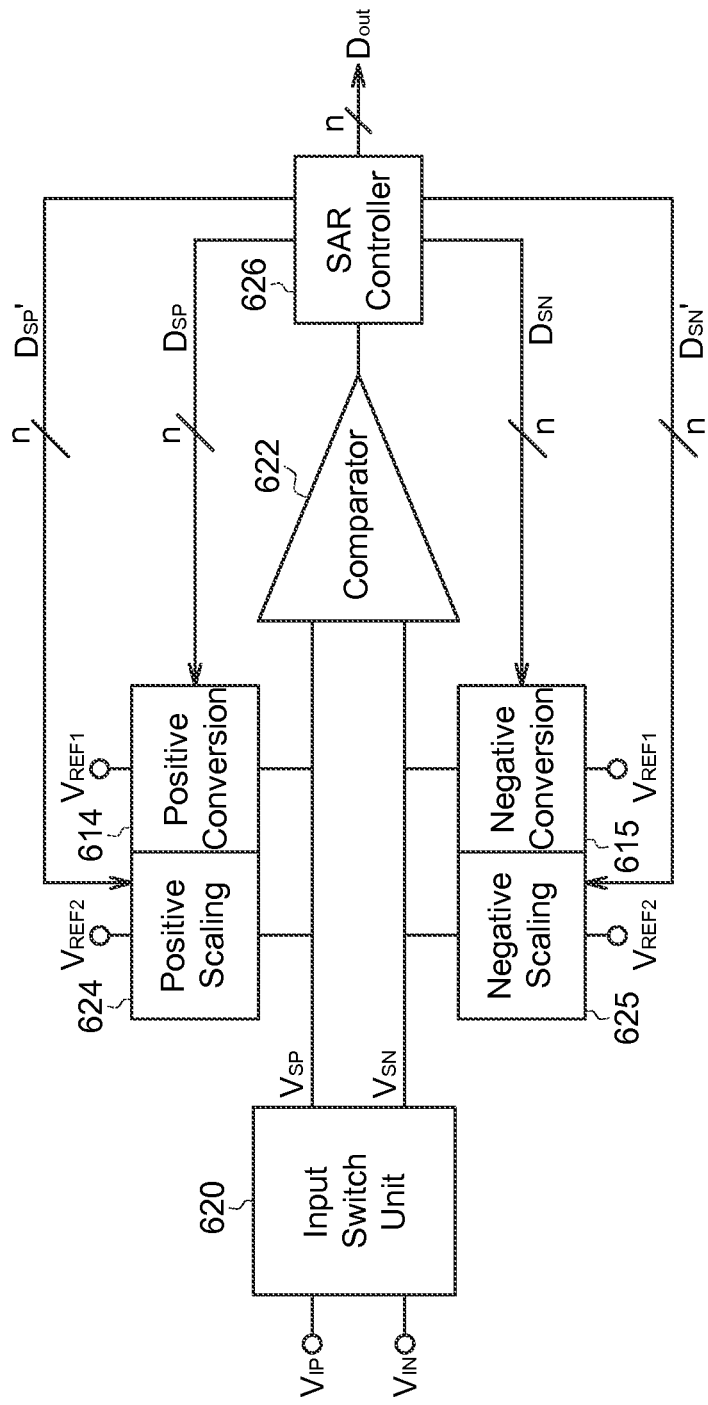
FIG. 20 illustrates a circuit diagram of the SAR ADC with differential input and with a scaling capacitor array according to an embodiment of the invention.

FIG. 20 illustrates a circuit diagram of the SAR ADC with differential input and with a scaling capacitor array according to an embodiment of the invention. In this embodiment, extra scaling capacitor array is added in order to adjust the scaling factor k0. The related control method is similar to that of SAR ADC 42 shown in FIG. 14 and flowcharts shown in FIG. 25 and FIG. 26, and thus is not repeated here.

The proposed SAR ADC has inherent ELD compensation characteristic and thus is suitable for being used as a quantizer in a continuous-time delta-sigma modulator. Since the ELD compensation is implicitly included in the SAR ADC, there is no extra hardware requirement for the ELD compensation. In addition, with the scaling capacitor array, the actual ELD compensation value can be adjusted dynamically according to the real circuit delay. Therefore ELD compensation with the proposed SAR ADC can achieve low hardware area overhead and great usage flexibility.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A successive approximation register analog to digital converter, for generating a digital code in response to a differential analog input signal, comprising:
a comparator, having a first input terminal and a second input terminal;
an input switch unit, arranged to couple the differential analog input signal to the comparator during a sampling phase and decouple the differential analog input signal to the comparator during a conversion phase;
a positive conversion capacitor array, comprising a plurality of first positive capacitors and a plurality of first positive switches, arranged to sample a positive end of the differential analog input signal during the sampling phase, wherein each first positive capacitor is coupled between the first input terminal of the comparator and a corresponding first positive switch, respectively, for selectively coupling the first positive capacitor to either a first reference voltage or a common voltage;
a negative conversion capacitor array, comprising a plurality of first negative capacitors and a plurality of first negative switches, arranged to sample a negative end of the differential analog input signal during the sampling phase, wherein each first negative capacitor is coupled between the second input terminal of the comparator and a corresponding first negative switch, respectively, for selectively coupling the first negative capacitor to either the first reference voltage or the common voltage; and a successive approximation register (SAR) controller, arranged to reset the first positive switches and the first negative switches at the end of the sampling phase to change an input voltage difference between the first and second input terminals of the comparator into a residual signal, generate an intermediate digital code to control the first positive switches and the first negative switches during the conversion phase according to an output of the comparator to convert the residual signal to the intermediate digital code, generate the digital code according to the intermediate digital code, and use an inverted intermediate digital code to control the first positive switches and the first negative switches at the end of the conversion phase.

2. The converter of claim 1, further comprises:

a positive scaling capacitor array, comprising a plurality of second positive capacitors and a plurality of second positive switches, arranged to sample the positive end of the differential analog input signal during the sampling phase, wherein each second positive capacitor is coupled between the first input terminal of the comparator and a corresponding second positive switch, respectively, for selectively coupling the second positive capacitor to either a second reference voltage or the common voltage;

a negative scaling capacitor array, comprising a plurality of second negative capacitors and a plurality of second negative switches, arranged to sample the negative end of the differential analog input signal during the sampling phase, wherein each second negative capacitor is coupled between the second input terminal of the comparator and a corresponding second negative switch, respectively, for selectively coupling the second negative capacitor to either the second reference voltage or the common voltage, wherein the SAR controller resets the second positive switches and the second negative switches at the end of the sampling phase.

3. The converter of claim 2, wherein the SAR controller uses an inverted intermediate digital code to control the second positive switches and the second negative switches at the end of the conversion phase.

4. The converter of claim 2, wherein the SAR controller uses the intermediate digital code to control the second positive switches and the second negative switches at the end of the conversion phase.

5. The converter of claim 2, wherein a second capacitance value of each second positive and negative capacitor is K times of a first capacitance value of the corresponding first positive and negative capacitor, K being a positive real number.

6. The converter of claim 2, wherein the second reference voltage is K times of the first reference voltage, K being a positive real number.

7. A successive approximation register analog to digital converter, for generating a digital code in response to a differential analog input signal, comprising:

a comparator, having a first input terminal and a second input terminal;

an input switch with polarity inversion unit, arranged to couple the differential analog input signal to the comparator during a sampling phase and decouple the differential analog input signal to the comparator during a conversion phase, couple a positive and negative end of the differential analog input signal to the first and second input terminal of the comparator, respectively, in a normal cycle, and couple the positive and negative end of the differential analog input signal to the second and first input terminal of the comparator, respectively, in an alternate cycle, wherein each of the normal cycle and the alternate cycle comprises the sampling phase and the conversion phase;

a positive conversion capacitor array, comprising a plurality of first positive capacitors and a plurality of first positive switches, arranged to sample voltage at the first input terminal of the comparator during the sampling phase, wherein each first positive capacitor is coupled between the first input terminal of the comparator and a corresponding first positive switch, respectively, for selectively coupling the first positive capacitor to either a first reference voltage or a common voltage;

a negative conversion capacitor array, comprising a plurality of first negative capacitors and a plurality of first negative switches, arranged to sample voltage at the second input terminal of the comparator during the sampling phase, wherein each first negative capacitor is coupled between the second input terminal of the comparator and a corresponding first negative switch, respectively, for selectively coupling the first negative capacitor to either the first reference voltage or the common voltage; and a successive approximation register (SAR) controller, arranged to reset the first positive switches and the first negative switches at the end of the sampling phase to change an input voltage difference between the first and second input terminals of the comparator into a residual signal, generate an intermediate digital code to control the first positive switches and the first negative switches during the conversion phase according to an output of the comparator to convert the residual signal to the intermediate digital code, and generate the digital code by inverting the intermediate digital code in every alternate cycle.

8. The converter of claim 7, further comprises:

a positive scaling capacitor array, comprising a plurality of second positive capacitors and a plurality of second positive switches, arranged to sample voltage at the first input terminal of the comparator during the sampling phase, wherein each second positive capacitor is coupled between the first input terminal of the comparator and a corresponding second positive switch, respectively, for selectively coupling the second positive capacitor to either a second reference voltage or the common voltage;

a negative scaling capacitor array, comprising a plurality of second negative capacitors and a plurality of second negative switches, arranged to sample voltage at the second input terminal of the comparator during the sampling phase, wherein each second negative capacitor is coupled between the second input terminal of the comparator and a corresponding second negative switch, respectively, for selectively coupling the second negative capacitor to either the second reference voltage or the common voltage, wherein the SAR controller resets the second positive switches and the second negative switches at the end of the sampling phase.

9. The converter of claim 8, wherein the SAR controller uses the intermediate digital code to control the second positive switches and the second negative switches at the end of the conversion phase.

10. The converter of claim 8, wherein the SAR controller uses an inverted intermediate digital code to control the second positive switches and the second negative switches at the end of the conversion phase.

11. The converter of claim 8, wherein a second capacitance value of each second positive and negative capacitor is K times of a first capacitance value of the corresponding first positive and negative capacitor, K being a positive real number.

12. The converter of claim 8, wherein the second reference voltage is K times of the first reference voltage, K being a positive real number.

13. A successive approximation register analog to digital converter, for generating a digital code in response to an analog input signal, comprising:
    a comparator, having a first input terminal and a second input terminal, wherein the second input terminal is coupled to a base voltage;
    an input switch unit, arranged to couple the analog input signal to the comparator during a sampling phase and decouple the analog input signal to the comparator during a conversion phase;
    a conversion capacitor array, comprising a plurality of first capacitors and a plurality of first switches, arranged to sample the analog input signal during the sampling phase, wherein each first capacitor is coupled between the first input terminal of the comparator and a corresponding first switch, respectively, for selectively coupling the first capacitor to either a first reference voltage or a common voltage; and
    a successive approximation register (SAR) controller, arranged to reset the first switches at the end of the sampling phase to change the sampled analog input signal into a residual signal, generate an intermediate digital code to control the first switches during the conversion phase according to an output of the comparator to convert the residual signal to the intermediate digital code, generate the digital code according to the intermediate digital code, and use an inverted intermediate digital code to control the first switches at the end of the conversion phase.

14. The converter of claim 13, further comprises a scaling capacitor array, comprising a plurality of second capacitors and a plurality of second switches, arranged to sample the analog input signal during the sampling phase, wherein each second capacitor is coupled between the first input terminal of the comparator and a corresponding second switch, respectively, for selectively coupling the second capacitor to either a second reference voltage or the common voltage,
    wherein the SAR controller resets the second switches at the end of the sampling phase.

15. The converter of claim 14, wherein the SAR controller uses an inverted intermediate digital code to control the second switches at the end of the conversion phase.

16. The converter of claim 14, wherein the SAR controller uses the intermediate digital code to control the second switches at the end of the conversion phase.

17. The converter of claim 14, wherein a second capacitance value of each second capacitor is K times of a first capacitance value of the corresponding first capacitor, K being a positive real number.

18. The converter of claim 14, wherein the second reference voltage is K times of the first reference voltage, K being a positive real number.

19. A successive approximation register analog to digital converter, for generating a digital code in response to an analog input signal, comprising:
    a comparator, having a first input terminal and a second input terminal, wherein the second input terminal is coupled to a base voltage;
    an input switch with polarity inversion unit, arranged to couple the analog input signal to the comparator during a sampling phase and decouple the analog input signal to the comparator during a conversion phase, and perform polarity inversion on the analog input signal every alternate cycle to generate a modified input signal, wherein one cycle comprises the sampling phase and the conversion phase;
    a conversion capacitor array, comprising a plurality of first capacitors and a plurality of first switches, arranged to sample the modified input signal during the sampling phase, wherein each first capacitor is coupled between the first input terminal of the comparator and a corresponding first switch, respectively, for selectively coupling the first capacitor to either a first reference voltage or a common voltage; and
    a successive approximation register (SAR) controller, arranged to reset the first switches at the end of the sampling phase to change the modified input signal into a residual signal, generate an intermediate digital code to control the first switches during the conversion phase according to an output of the comparator to convert the residual signal to the intermediate digital code, and generate the digital code by inverting the intermediate digital code every alternate cycle.

20. The converter of claim 19, further comprises a scaling capacitor array, comprising a plurality of second capacitors and a plurality of second switches, arranged to sample the modified input signal during the sampling phase, wherein each second capacitor is coupled between the first input terminal of the comparator and a corresponding second switch, respectively, for selectively coupling the second capacitor to either a second reference voltage or the common voltage,
    wherein the SAR controller resets the second switches at the end of the sampling phase.

21. The converter of claim 20, wherein the SAR controller uses the intermediate digital code to control the second switches at the end of the conversion phase.

22. The converter of claim 20, wherein the SAR controller uses an inverted intermediate digital code to control the second switches at the end of the conversion phase.

23. The converter of claim 20, wherein a second capacitance value of each second capacitor is K times of a first capacitance value of the corresponding first capacitor, K being a positive real number.

24. The converter of claim 20, wherein the second reference voltage is K times of the first reference voltage, K being a positive real number.

* * * * *